(12) United States Patent
Kim et al.

(10) Patent No.: US 6,805,744 B2
(45) Date of Patent: Oct. 19, 2004

(54) METHOD OF PRODUCING DEVICE QUALITY (AL)INGAP ALLOYS ON LATTICE-MISMATCHED SUBSTRATES

(75) Inventors: Andrew Y. Kim, Cambridge, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/023,047

(22) Filed: Dec. 13, 2001

(65) Prior Publication Data

US 2002/0144645 A1 Oct. 10, 2002

Related U.S. Application Data

(63) Continuation of application No. 09/499,217, filed on Nov. 24, 1999, now abandoned.
(60) Provisional application No. 60/109,619, filed on Nov. 24, 1998.

(51) Int. Cl.$^7$ ............................................. C30B 25/06
(52) U.S. Cl. ........................... 117/94; 117/95; 117/101; 117/89; 117/955
(58) Field of Search ............................. 117/94, 95, 101, 117/955, 89

(56) References Cited

U.S. PATENT DOCUMENTS

| 4,218,270 A | 8/1980 | Hasegawa et al. |
| 4,378,259 A | 3/1983 | Hasegawa et al. |
| 4,680,602 A | 7/1987 | Watanabe et al. ............. 357/17 |
| 6,064,076 A | 5/2000 | Chen et al. |

FOREIGN PATENT DOCUMENTS

| DE | 19756856 | 7/1998 |
| JP | 06-061525 | 11/1979 |
| JP | 54-146984 | 11/1979 |

OTHER PUBLICATIONS

Chin, T.P., J.C.P. Chang, K.L. Kavanagh and C.W. Tu, "Gas–source molecular beam epitaxial growth, characterization, and light–emitting diode application of In$_x$Ga$_{1-x}$P on GaP(100)," *Applied Physics Letters*, vol. 62, No. 19, May 10, 1993, pp. 2369–2371.

Kim, A.Y. and E.A. Fitzgerald, "Engineering Dislocation Dynamics in In$_x$(Al$_y$Ga$_{1-y}$)$_{1-x}$P Graded Buffers Grow on GaP by MOVPE," presented at the Defect and Impurity Engineered Semiconductors II Symposium, San Francisco, California, Apr. 13–17, 1998, published in Materials Researc Society Symposium Procedures, vol. 510, pp. 131–135.

*Primary Examiner*—Robert Kunemund
(74) *Attorney, Agent, or Firm*—Gauthier & Connors LLP

(57) ABSTRACT

A method of forming a semiconductor structure including providing a single crystal semiconductor substrate of GaP, and fabricating a graded composition buffer including a plurality of epitaxial semiconductor In$_x$(Al$_y$Ga$_{1-y}$)$_{1-x}$P alloy layers. The buffer includes a first alloy layer immediately contacting the substrate having a lattice constant that is nearly identical to that of the substrate, subsequent alloy layers having lattice constants that differ from adjacent layers by less than 1%, and a final alloy layer having a lattice constant that is substantially different from the substrate. The growth temperature of the final alloy layer is at least 20° C. less than the growth temperature of the first alloy layer.

56 Claims, 13 Drawing Sheets

| SERIES | I | I | II | II | II | III | III | III | III | IV |
|---|---|---|---|---|---|---|---|---|---|---|
| GROWTH TEMPERATURE | 760°C | 760°C | 700°C | 760°C | 810°C | 650°C | 700°C | 760°C | 800°C | VARIABLE |
| PH₃ PRESSURE | 800 pa | 800 pa | 2600 pa | 800 pa | 2600 pa | 2600 pa | 2600 pa | 800 pa | 800 pa | VARIABLE |
| INDIUM COMPOSITION (NOMINAL/MEASURED) | 0.27/ 0.26 | 0.32/ 0.31 | 0.33/ 0.34 | 0.33/ 0.31 | 0.33/ 0.36 | 0.10/ 0.15 | 0.10/ 0.09 | 0.10/ 0.11 | 0.10/ 0.12 | 0.40/ 0.39 |
| GRADING RATE | VARIABLE | VARIABLE | CONSTANT | CONSTANT | CONSTANT | CONSTANT | CONSTANT | CONSTANT | CONSTANT | CONSTANT |

*FIG. 1*

*FIG. 2*
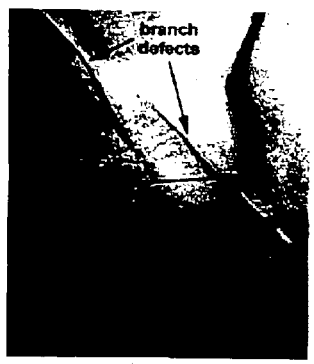 
*FIG. 4A*     *FIG. 4B*
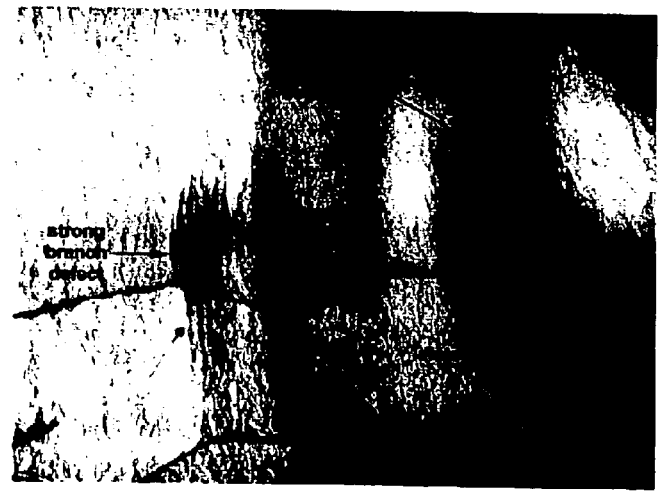
*FIG. 5*

| TEMPERATURE | 760°C | 760°C |
|---|---|---|
| $x$ | 0.26 | 0.31 |
| $R_q$ - (10μm)² scan area | 25 nm ± 6 nm | 45 nm ± 25 nm |
| $\beta_{(004)}$ | 170' ± 8' | 303' ± 10' |
| $\rho_{field}$ - PVTEM | 6.3 × 10⁶ cm⁻² ± 2.4 × 10⁶ cm⁻² | 1.1 × 10⁸ cm⁻² ± 0.2 × 10⁸ cm⁻² |
| $\rho_{pileup}$ - CL | 377 cm⁻¹ | 1128 cm⁻¹ |
| $\rho_{linear}$ - PVTEM | 2.7 × 10⁴ cm⁻¹ | 1.2 × 10⁵ cm⁻¹ |
| $\rho_{overall}$ - PVTEM + CL | 1.6 × 10⁷ cm⁻² | 2.5 × 10⁸ cm⁻² |
| $\rho_{branch}$ (transverse) - PVTEM | 6000 cm⁻¹ ± 196 cm⁻¹ | 4773 cm⁻¹ ± 693 cm⁻¹ |
| $\rho_{branch}$ (axial) - PVTEM | 939 cm⁻¹ ± 61 cm⁻¹ | 832 cm⁻¹ ± 110 cm⁻¹ |

*FIG. 3*

| TEMPERATURE | 700°C | 760°C | 810°C |
|---|---|---|---|
| $x$ | 0.34 | 0.31 | 0.36 |
| $R_q - (10\mu m)^2$ | 13 nm ± 2 nm | 68 nm ± 25 nm | 118 nm ± 20 nm |
| $\beta_{(004)}$ | 275' ± 10' | 420' ± 30' | — |
| $\rho_{field}$ - CL | $4.9 \times 10^6$ cm$^{-2}$ ± $0.9 \times 10^6$ cm$^{-2}$ | — | — |
| $\rho_{field}$ - PVTEM | $4.4 \times 10^6$ cm$^{-2}$ ± $1.0 \times 10^6$ cm$^{-2}$ | — | — |
| $\rho_{pileup}$ - CL | 92 cm$^{-1}$ ± 23 cm$^{-1}$ | > 2000 cm$^{-1}$ | — |
| $\rho_{lines}$ - CL + PVTEM | $2.1 \times 10^5$ cm$^{-1}$ | — | — |
| $\rho_{overall}$ - CL + PVTEM | $6.8 \times 10^6$ cm$^{-2}$ ± $2.0 \times 10^6$ cm$^{-2}$ | $1.5 \times 10^9$ cm$^{-2}$ ± $0.3 \times 10^9$ cm$^{-2}$ | — |
| $\rho_{branch}$ (transverse) | 7970 cm$^{-1}$ ± 327 cm$^{-1}$ | 5433 cm$^{-1}$ ± 529 cm$^{-1}$ | — |

*FIG. 7*

| TEMPERATURE | 650°C | 700°C | 760°C | 800°C |
|---|---|---|---|---|
| x | 0.15 | 0.09 | 0.11 | 0.12 |
| $R_q$ - $(10\mu m)^2$ scan | 8.5 nm ± 1.5 nm | 7.7 nm ± 1 nm | 6.0 nm ± 0.5 nm | 4.9 nm ± 0.5 nm |
| $R_q$ - $(50\mu m)^2$ scan | 12.2 nm ± 1.5 nm | 10.5 nm ± 1 nm | 7.4 nm ± 0.5 nm | 6.0 nm ± 0.5 nm |
| $\beta_{(004)}$ | 93' ± 5' | 58' ± 3' | 54' ± 3' | 53' ± 3' |
| $\rho_{field}$ - PVTEM | $1.2 \times 10^7$ cm$^{-2}$ ± $0.3 \times 10^7$ cm$^{-2}$ | $3.9 \times 10^6$ cm$^{-2}$ ± $1.4 \times 10^6$ cm$^{-2}$ | $1.1 \times 10^6$ cm$^{-2}$ ± $0.6 \times 10^6$ cm$^{-2}$ | $4.0 \times 10^5$ cm$^{-2}$ ± $1.9 \times 10^5$ cm$^{-2}$ |
| $\rho_{branch}$ (transverse) - PVTEM | 26911 cm$^{-1}$ ± 2265 cm$^{-1}$ | 9808 cm$^{-1}$ ± 654 cm$^{-1}$ | — | — |
| $\rho_{branch}$ (transverse) - AFM | 24114 cm$^{-1}$ ± 7312 cm$^{-1}$ | — | — | — |
| Crosshatch Wavelength <011>-A | — | — | 3.4 μm ± 0.9 μm, 8.7 μm ± 0.5 μm | 3.0 μm ± 0.3 μm, 7.0 μm ± 1.1 μm |
| Crosshatch Amplitude <011>-A | — | — | 9.9 nm ± 1.5 nm, 14.7 nm ± 2.4 nm | 7.9 nm ± 1.2 nm, 11.7 nm ± 1.3 nm |
| Crosshatch Wavelength <011>-B | — | — | 4.6 μm ± 0.7 μm, 8.5 μm ± 1.3 μm | 3.0 μm ± 0.4 μm, 6.3 μm ± 1.5 μm |
| Crosshatch Amplitude <011>-B | — | — | 10.5 nm ± 2.9 nm, 17.4 nm ± 2.7 nm | 8.6 nm ± 1.2 nm, 12.4 nm ± 1.7 nm |

*FIG. 9*

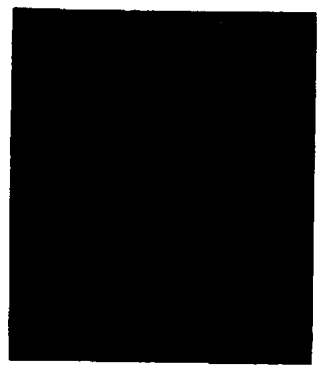
*FIG. 11A*    *FIG. 11B*
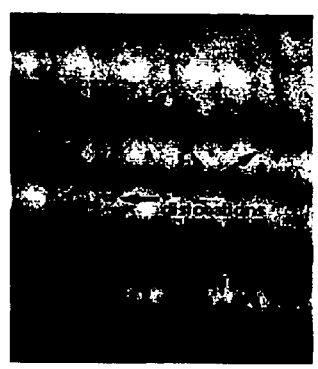
*FIG. 13A*    *FIG. 13B*

| TEMPERATURE | 760°C / 700°C / 650°C |
|---|---|
| x | 0.389 |
| $R_q$ – (10 µm)² scan | 13 nm ± 4 nm |
| $\beta_{(004)}$ | 277' ± 10' |
| $\rho_{field}$ – CL | $4.1 \times 10^8$ cm$^{-2}$ <br> ± $0.5 \times 10^6$ cm$^{-2}$ |
| $\rho_{field}$ – PVTEM | $3.7 \times 10^6$ cm$^{-2}$ <br> ± $0.8 \times 10^6$ cm$^{-2}$ |
| $\rho_{pileup}$ – CL | 71 cm$^{-1}$ ± 18 cm$^{-1}$ |
| $\rho_{linear}$ – CL + PVTEM | $8.5 \times 10^3$ cm$^{-1}$ |
| $\rho_{overall}$ – CL + PVTEM | $4.7 \times 10^6$ cm$^{-2}$ <br> ±$1.1 \times 10^6$ cm$^{-2}$ |
| $\rho_{branch}$ (transverse) - PVTEM | 24636 cm$^{-1}$ <br> ± 821 cm$^{-1}$ |
| $\rho_{branch}$ (transverse) - AFM | 24000 cm$^{-1}$ <br> ± XXX cm$^{-1}$ |

*FIG. 12*

METHOD OF PRODUCING DEVICE QUALITY (AL)INGAP ALLOYS ON LATTICE-MISMATCHED SUBSTRATES

PRIORITY INFORMATION

This application is a continuation of Ser. No. 09/499,217 filed Nov. 24, 1999, now abandoned, which claims priority from provisional application Ser. No. 60/109,619 filed on Nov. 24, 1998.

This invention was made with government support under Grant No. DAAG55-97-1-0111 awarded by the United States Army. The government has certain rights in the invention.

BACKGROUND OF THE INVENTION

The invention relates to the field of producing device quality (Al)InGaP alloys on lattice-mismatched substrates.

Epitaxial graded composition buffers of $In_xGa_{1-x}P$ on GaP substrates ($In_xGa_{1-x}P$/GaP) are promising substrates for high performance optoelectronic devices. $In_xGa_{1-x}P$ alloys with large bandgaps that are difficult or impossible to achieve lattice-matched to GaAs substrates can be grown on graded buffers, providing direct bandgap emission of the critical green to orange wavelengths that lie between the capabilities of GaN-based and GaAs-based light emitting diode (LED) and laser diode technologies. $In_xGa_{1-x}P$/GaP substrates are also inherently transparent to devices grown on them, which roughly doubles light extraction efficiency in LEDs compared to absorbing substrates such as GaAs. The transparency of $In_xGa_{1-x}P$/GaP has also been used to produce negative electron affinity GaAs and InGaAs photocathodes that operate in transmission mode, and a variety of other optoelectronic detectors and modulators can be envisioned to take advantage of a transparent semiconductor substrate. Furthermore, GaP is nearly lattice-matched to Si, so $In_xGa_{1-x}P$/GaP is one natural choice for integrating compound semiconductor devices on Si substrates.

Graded buffers are grown to efficiently relieve lattice-mismatch strain between substrates and films of differing lattice constants. For most optoelectronic device applications, direct bandgap compositions of $In_xGa_{1-x}P$ are desired. The >2% lattice-mismatch between GaP and direct bandgap compositions of $In_xGa_{1-x}P$ results in heavily defective single heterostructures, due to the large and abrupt introduction of strain at one interface. A graded buffer of $In_xGa_{1-x}P$ on GaP slowly introduces strain over many interfaces, which minimizes dislocation interactions, maintains a low state of strain, and minimizes dislocation nucleation during growth. Consequently, graded buffers typically have orders of magnitude lower threading dislocation densities than single heterostructures.

The growth of $In_xGa_{1-x}P$/GaP has been studied for decades using a variety of growth techniques, including hydride vapor phase epitaxy (HVPE), gas-source molecular beam epitaxy (GSMBE), and metal-organic vapor phase epitaxy (MOVPE). Early HVPE experiments with $In_xGa_{1-x}P$/GaP and $GaAs_xP_{1-x}$/GaAs established some of the basic principles of dislocation dynamics in graded buffers. Since then, visible LEDs have been demonstrated on $In_xGa_{1-x}P$/GaP. HVPE has been used to produce LEDs operating at wavelengths from 565 nm to 650 nm, however, device efficiency decreases dramatically when $In_xGa_{1-x}P$/GaP is graded beyond x~0.35. GSMBE has been used to grow $In_xGa_{1-x}P$/GaP with photoluminescence (PL) ranging from 560 nm to 600 nm, with decreasing PL intensity in buffers graded beyond x~0.32.

The agreement of results showing degradation beyond x~0.3 with two very different growth techniques is striking. Both techniques result in the conclusion that material degradation is a natural consequence of increasing lattice-mismatch, presumably through increasing defect density. This intuitive picture is inconsistent with earlier work, which concluded from experimental and theoretical considerations that strain relaxation in graded buffers is a steady-state process, hence defect density should be constant.

Developments in the $Ge_xSi_{1-x}$/Si system have provided new insights into dislocation dynamics in graded buffers that can aid in understanding $In_xGa_{1-x}P$/GaP. It has been demonstrated that the formation of dislocation pileups is the primary cause of material degradation with continued grading in $Ge_xSi_{1-x}$/Si. Since dislocations immobilized in pileups can no longer glide to relieve strain, pileups force the nucleation of additional dislocations to continue the relaxation process. It has been proposed that pileups were caused by an interaction between dislocations and surface roughness. Misfit dislocation strain fields produce surface undulations and gliding dislocations can be pinned in between, which leads to pileups. Surface roughness increases as more dislocations are pinned, resulting in a recursive and escalating cycle of dislocation pinning and surface roughening. It was then showed that controlling surface roughness by periodic planarization can suppress pileup formation in $Ge_xSi_{1-x}$/Si and recover a steady-state dislocation density between x=0.3 to x=1. The recovery of steady-state dislocation dynamics is compelling evidence that pileup formation due to the interaction of dislocations and surface roughness is responsible for material degradation with continued grading.

Recent work with $In_xGa_{1-x}P$/GaP grown by MOVPE also showed a strong correlation between surface roughness and the density of dislocations and pileups. Pileup formation was tentatively attributed to the proposed mechanisms, but comparison with $Ge_xSi_{1-x}$/Si results suggests that the sensitivity of defect density to surface roughness is much greater than expected in $In_xGa_{1-x}P$/GaP. Related work with $In_xGa_{1-x}As$/GaAs noted the presence of "high-energy boundaries" that appeared to pin dislocations, although their overall impact on relaxation was unclear. Defects similar to the "high-energy boundaries" have not been observed in $Ge_xSi_{1-x}$/Si, so defects of this type may account for the difference in pileup behavior noticed between $In_xGa_{1-x}P$/GaP and $Ge_xSi_{1-x}$/Si.

SUMMARY OF THE INVENTION

In accordance with the invention, the evolution of dislocation dynamics in $In_xGa_{1-x}P$/GaP grown by MOVPE is explored. Starting with the question of escalating defect density a previously unrecognized defect microstructure that causes pileups and dominates dislocation dynamics in $In_xGa_{1-x}P$/GaP is shown by microscopic characterization and macroscopic modeling. The evolution of microstructure in graded buffers is mapped, and its interaction with dislocation dynamics is modeled. By controlling the new defect microstructure, nearly ideal relaxation behavior dominated by dislocation kinetics is also observed. Through analysis and modeling, a proposed kinetic model for relaxation in graded buffers is confirmed. The evolution of branch defects is used to explain the microstructure of both indium-bearing phosphides and arsenides over a wide range of conditions. The new understanding and control of dislocation dynamics and microstructure are used to derive a set of design rules and an optimization strategy for high quality graded buffer growth. A simple process optimization results in material with a dislocation density of $4.7 \times 10^6$ cm$^{-2}$ at x=0.39.

Accordingly, the invention provides a method of forming a semiconductor structure including providing a single crystal semiconductor substrate of GaP, and fabricating a graded composition buffer including a plurality of epitaxial semiconductor $In_x(Al_yGa_{1-y})_{1-x}P$ alloy layers. The buffer includes a first alloy layer immediately contacting the substrate having a lattice constant that is nearly identical to that of the substrate, subsequent alloy layers having lattice constants that differ from adjacent layers by less than 1%, and a final alloy layer having a lattice constant that is substantially different from the substrate. The growth temperature of the final alloy layer is at least 20° C. less than the growth temperature of the first alloy layer.

BRIEF DESCRIPTION OF THE DRAWINGS

FIG. 1 is a table of the general growth conditions for all $In_xGa_{1-x}P/GaP$ samples in accordance with the invention;

FIG. 2 is an XTEM image of a $In_xGa_{1-x}P/GaP$ sample graded to x=0.11 at 760° C.;

FIG. 3 is a table of materials characterization results for series I, $In_xGa_{1-x}P/GaP$ grown at 760° C. with variable grading rates;

FIGS. 4A and 4B are PVTEM images of $In_xGa_{1-x}P/GaP$ graded to x=0.26 and x=0.31, respectively, at 760° C.;

FIG. 5 is an XTEM image of $In_xGa_{1-x}P/GaP$ graded to x=0.26 at 760° C.;

FIG. 7 is a table of materials characterization results for series II: $In_xGa_{1-x}P/GaP$ graded to x~0.33;

FIG. 9 is a table of materials characterization results for series III: $In_xGa_{1-x}P/GaP$ graded to x~0.1;

FIGS. 11A and 11B are PVTEM images of $In_xGa_{1-x}P/GaP$ graded to x~0.1 at 650° C. and 760° C., respectively;

FIG. 12 is a table of materials characterization results for series IV: $In_xGa_{1-x}P/GaP$ graded to x~0.33 with growth temperature optimization;

FIGS. 13A and 13B are PVTEM and CL images, respectively, of $In_xGa_{1-x}P/GaP$ graded to x~0.33 with growth temperature optimized as a function of composition;

DETAILED DESCRIPTION OF THE INVENTION

Figure 6A:
FIGS. 6A and 6B are PVTEM and XTEM images, respectively, of pileups in $In_xGa_{1-x}P/GaP$ grown at 760° C.

Graded composition buffers of $In_xGa_{1-x}P$ are grown on GaP ($In_xGa_{1-x}P/GaP$) by metal-organic vapor phase epitaxy to observe the dislocation dynamics of strain relaxation in these structures and to develop a strategy for creating LED-quality InGaP layers. Transmission electron microscopy, cathodoluminescence imaging, atomic force microscopy, and triple-axis x-ray diffraction are applied to the characterization of $In_xGa_{1-x}P/GaP$ with final compositions ranging from x=0.09 to x=0.39 and growth temperatures ranging from 650° C. to 810° C. The previously reported escalation of defect density with continued grading of $In_xGa_{1-x}P/GaP$ beyond x~0.3 is found to be due to the formation of dislocation pileups. A new defect microstructure with a branch morphology and featuring sharp local strain fields, hereafter referred to as branch defects, is observed to pin dislocations and cause the dislocation pileups. Branch defect morphology varies strongly with growth temperature, becoming significantly stronger with increasing growth temperature and causing severe material degradation above 700° C.

Further experiments show that branch defects evolve during growth and that the onset of branch defect formation can be delayed by increasing growth temperature. The evolution of branch defects appears to control the microstructure of indium-bearing phosphides and arsenides over a very wide range of conditions. In the absence of branch defects at high growth temperatures and low indium compositions near x~0.1, nearly ideal dislocation dynamics dominated by dislocation glide kinetics are recovered, providing the first experimental proof of a kinetic model for graded buffer relaxation. The new understanding of the evolution of microstructure and dislocation dynamics in $In_xGa_{1-x}P/GaP$ suggests that growth temperature must be optimized as a function of composition for optimal material quality. A simple process optimization in $In_xGa_{1-x}P/GaP$ graded to x=0.39 results in an overall threading dislocation density of $4.7 \times 10^6$ cm$^{-2}$, which is the lowest reported value to date for x>0.3. Combining the new observations with earlier findings, three basic design rules are presented for producing practical, device-quality graded buffers: branch defects must be avoided or suppressed, growth temperature must be maximized, and surface roughness must be minimized. Using these design rules, several optimization strategies for achieving device-quality substrate materials are also presented. Applying these design rules and optimization strategies, threading dislocation densities of $<10^6$ cm$^{-2}$ in $In_xGa_{1-x}P/GaP$ are achieved over the full range of useful compositions.

Exemplary experiments in accordance with the invention will now be described.

MOVPE film growth was performed in a Thomas Swan atmospheric pressure MOVPE reactor. Trimethylgallium (TMGa), solution trimethylindium (TMIn), and trimethylaluminum (TMAl) were used as group III sources, and $PH_3$ and AsH$_3$ were used as group V sources. Source gases were carried in Pd-purified H$_2$ flowing at 5 slpm through a fast-switching manifold with parallel, pressure-balanced vent and reactor lines. Substrates were placed on a graphite susceptor in a horizontal, rectangular quartz reactor. Growth temperature was controlled through a halogen lamp under the reactor and a thermocouple inside the susceptor.

The substrates were S-doped (001) GaP substrates off-cut 10° towards a {001}. To prepare substrates for growth, wafers were cleaved into approximately 5 cm$^2$ pieces, etched for 1 min in 25:1:1 H$_2$SO$_4$:H$_2$O$_2$:H$_2$O, rinsed with deionized water, and dried with N$_2$. The substrates were then loaded into the reactor and baked for 2 min at 150° C., 5 min at 200° C., and 15 min at 800° C. under a flow of H$_2$ and PH$_3$. The desired growth temperature was then set and allowed to stabilize for 5 min.

Film growth began with a 0.5 μm GaP buffer layer grown at 3 μm/hr. Graded buffers were then grown by setting a constant TMGa flow of 0.235 sccm and stepping TMIn flow up in 2 min intervals. The group III flows corresponded to growth rates ranging from 3 μm/hr to 6 μm/hr as a function of temperature and composition. For changes in growth temperature, growth was interrupted and the system was equilibrated at the new temperature for 5 min. Growth was completed with a 4 μm uniform composition cap layer and samples were cooled under a flow of H$_2$ and PH$_3$ down to 150° C. Throughout the growth process, the PH$_3$ flow was adjusted to at least twice the level previously found necessary for the high-quality growth of GaP/GaP and In$_{0.31}$Ga$_{0.69}$P/GaAs$_{0.64}$P$_{0.36}$ in the reactor.

All graded buffers were grown with a nominal mean grading rate of 0.4% strain/μm, which corresponds to 5% In/μm. To maintain a constant grading rate profile, TMIn flow step size was increased continuously. To produce a variable grading rate profile that begins at 0.70%/μm and decreases to 0.2%/μm, TMIn flow step size was kept constant.

A 4 μm film of In$_{0.33}$Ga$_{0.67}$P was grown directly on GaP at 700° C. as a reference. Five series of graded buffer experiments were performed and are summarized in the table of FIG. 1. The table of FIG. 1 shows the general growth conditions for all In$_x$Ga$_{1-x}$P/GaP samples. All graded buffers were grown with an average growth rate of 5 μm/hr, an average grading rate of –0.4%/μm, and incorporated a 0.5 μm homoepitaxial GaP buffer and a 4 μm uniform composition cap layer.

Series I was grown to investigate the reports of luminescence degradation with continued grading beyond x~0.3 in In$_x$Ga$_{1-x}$P/GaP grown by HVPE and GSMBE. The growth temperature of 760° C. was chosen to be within the range typical of HVPE. Series II was grown to study the effect of growth temperature on buffers graded up to x~0.33. Series III was grown to study the effect of growth temperature on buffers graded up to x~0.1. Series IV was grown to optimize growth temperature as a function of composition: the sample was graded up to x=0.1 at 760° C., up to x=0.2 at 700° C., and up to x=0.4 at 650° C.

The microstructure of the graded buffers was examined by transmission electron microscopy in both plan-view (PVTEM) and cross-sectional (XTEM) configurations with a JEOL 2000FX operating at 200 kV. Panchromatic cathodoluminescence (CL) images were obtained with a JEOL scanning electron microscope fitted with a GaAs photomultiplier tube detector. Surface morphology was characterized by tapping-mode atomic force microscopy (AFM) using a Digital Instruments Dimension 3000 Nanoscope IIIa system and also by differential interference microscopy (DIC) using a Zeiss Axioplan microscope. Composition and Bragg peak width were determined by triple-axis x-ray diffraction (TAXRD) using a Bede D$^3$ diffractometer with a Rigaku rotating anode x-ray generator. Compositional grading was verified by cross-sectional Auger electron spectroscopy (AES) using a Physical Electronics Model 660 scanning Auger microprobe.

Accurately determining relatively low dislocation densities is the primary challenge in evaluating process optimization and making comparisons with the literature. The common practice of quoting detection limits for PVTEM is inadequate because it is neither accurate nor standardized: various authors have reported detection limits ranging from $10^5$ cm$^{-2}$ to $10^7$ cm$^{-2}$. Also, the sampling area of PVTEM is far too small to accurately measure the heterogeneous dislocation distributions that result from dislocation pileups. Large area techniques, such as CL or etch-pit density (EPD), can be used to evaluate low defect densities, but unfortunately both techniques have relatively large features sizes that limit resolution to approximately $2 \times 10^7$ cm$^{-2}$.

PVTEM and CL characterization and analysis were combined in series I, II, and IV to accurately measure the field threading dislocation density $\rho_{field}$, the dislocation pileup density, $\rho_{pileup}$, and the linear density of dislocations in pileups, $\rho_{linear}$. The indirect bandgap material in series III was difficult to characterize with CL, so only $\rho_{field}$ was measured by PVTEM. The overall threading dislocation density, $\rho_{overall}$, was calculated by:

$$\rho_{overall} = \rho_{field} + (\rho_{pileup} \times \rho_{linear})$$

The sample grown at 700° C. in series II and the optimized sample of series IV both have very low overall defect densities, so extensive characterization was performed to accurately determine defect densities. For each sample, approximately 50 CL images were taken at 600 X from different areas of the sample and approximately 100 PVTEM images were taken at 10 kX from three TEM foils prepared from different areas of the sample. The total sampling areas for each sample were approximately $7 \times 10^3$ μm$^2$ in PVTEM and $2.5 \times 10^5$ m$^2$ in CL.

The surface roughness and defect density of GaP substrates and the In$_{0.33}$Ga$_{0.67}$P film grown directly on GaP were characterized as references. For GaP, the surface RMS roughness, $R_q$, is 5 Å and CL imagining shows $\rho_{overall}=3 \times 10^4$ cm$^{-2}$. For In$_{0.33}$Ga$_{0.67}$P grown directly on GaP, $R_q>250$ nm and PVTEM shows $\rho_{overall} \sim 5 \times 10^9$ cm$^{-2}$.

All of the graded buffers exhibit the crosshatch surface morphology characteristic of efficient strain relaxation by dislocation glide in low-mismatch systems. Cross-sectional AES quantitatively verifies that compositional grading was achieved consistent with our growth process designs. XTEM with g=<004> reveals sharp, regular step-grade interfaces with misfit and threading dislocations. XTEM with g=<022> shows the expected networks of dislocations confined primarily to the graded buffers. The speckle contrast characteristic of III-V compound semiconductor alloys containing indium mixed with other group III species is seen in the uniform composition layers and in the graded buffers for x>0.05. FIG. 2 shows the substrate, graded buffer, and uniform composition layer in a typical sample. FIG. 2 is an XTEM of In$_x$Ga$_{1-x}$P/GaP graded to x=0.11 at 760° C. The dark lines confined primarily to the graded buffer are dislocations. The speckle contrast seen in the uniform composition layer and in the top half of the graded buffer is characteristic of III-V compound semiconductor alloys containing indium mixed with other group III species.

To investigate material degradation with continued grading, samples were graded to different final compositions under otherwise identical conditions. The first sample was graded to the indirect-direct energy gap transition at x~0.27, the lowest useful composition for direct energy gap devices, while the second sample was graded an additional Δx=0.05. Both samples in this series have specular surfaces with easily visible crosshatch. All quantitative indications of material quality show significant degradation between x=0.26 and x=0.31. The most marked change is an increase in $\rho_{overall}$ from $1.6 \times 10^7$ cm$^{-2}$ to $2.5 \times 10^8$ cm$^{-2}$, which correlates with increases in $\rho_{pileup}$ and $R_q$. Relevant quantitative data are summarized in the table of FIG. 3. FIG. 3 is a table of materials characterization results for series I, In$_x$Ga$_{1-x}$P/GaP grown at 760° C. with variable grading rates.

PVTEM reveals defects with a branching structure, hereafter referred to as branch defects, textured in one of the <011> directions, as shown in FIGS. 4A and 4B. FIGS. 4A and 4B are PVTEM of In$_x$Ga$_{1-x}$P/GaP graded to x=0.26 and x=0.31, respectively, at 760° C. The branch defects present in both images have significant local strain fields and strongly pin dislocations. The sample graded to x=0.31 has a much higher defect density because the branch defects pin existing dislocations and force the nucleation of additional dislocations as lattice mismatch is introduced by grading from x=0.26 up to x=0.31. The fine ridges are growth supersteps that do not appear to directly affect dislocation dynamics.

The density of branch defects, $\rho_{branch}$, is the same in both samples, approximately 5500 cm$^{-1}$ transverse and 900 cm$^{-1}$ axial, but the branch defects themselves are narrower and sharper in the sample graded to x=0.31. The branch defects show strong contrast for g=<022>, which suggests that the branch defects are crystallographic. Somewhat weaker contrast is also seen for g=<004>, indicating that the local strain fields in branch defects are strong enough to be visible under other diffraction conditions. Bend contours turn sharply where they intersect the branches, which also indicates significant strain in branch defects. The appearance of branch defects does not change in PVTEM foils prepared from material where the growth surface is polished down to $R_q$=5 Å, so branch defects are not merely topographic features. No strong topography is resolved in AFM that can be correlated with the branch defects, so any surface features caused by branch defects must be gentler than the general surface roughness of these samples.

Fine <001> ridges are also seen intersecting the branch defects in PVTEM. Ridges with the same density and orientation are also seen in AFM. The ridges are supersteps containing 2 to 10 growth steps that are roughly <001> oriented due to the {001} off cut of the substrate. The supersteps are a surface phenomenon and do not appear to directly affect dislocation dynamics. The supersteps are simply noted here to prevent confusion in interpretation of PVTEM images.

Observed in XTEM, the branch defects are vertical features that extend from within the graded buffer up to the surface, as shown in FIG. 5. FIG. 5 is an XTEM of In$_x$Ga$_{1-x}$P/GaP graded to x=0.26 at 760° C. The bright field image was taken slightly off the g=<022> condition for clearest contrast. Several branch defects are seen in cross-section and the strongest shows a wavy intereference contrast. The branch defects bend passing misfit dislocations and the degree of bending is proportional to their diffraction contrast strength, which is itself indicative of the strength of local strain fields associated with the branch defects.

As in PVTEM, the diffraction contrast is strong for g=<022> and weaker for g=<004>. The branches intersect the surface in gentle valleys that are less than 10 nm deep. Viewed down their <011> long axis, branch defects appear in close groups of one to four, consistent with the branching observed in PVTEM. The practical sampling length in XTEM is too small to obtain accurate statistics, but the $\rho_{branch}$=3716 cm$^{-1}$ measured along a 62 μm collage of XTEM images is consistent with the transverse $\rho_{branch}$ measured in PVTEM.

FIG. 5 shows that the branches bend passing misfit dislocations, again indicating significant local strain. The degree of bending depends on the strength of the diffraction contrast in the branch defects, which is reasonable since diffraction contrast should be proportional to the magnitude of local strain variations. The strongest branch defects have a wavy interference contrast in XTEM and appear with a density of approximately 485 cm$^{-1}$.

Figure 6B:

The branch defects also strongly pin gliding threading dislocations in both samples, as seen in FIGS. 6A and 6B. FIGS. 6A and 6B are PVTEM and XTEM images, respectively, of pileups in In$_x$Ga$_{1-x}$P/GaP grown at 760° C. Branch defects in both images clearly pin dislocations and result in dislocation pileups.

Extensive PVTEM suggests that most pileups occur on branch defects. The dislocation density near a pileup exceeds the value in the field areas between pileups by approximately one order of magnitude. Both CL and PVTEM show that pileup formation is moderate at x=0.26, but very severe by x=0.31. At x=0.26, the overall defect density is low enough to see individual dislocations pinned to branch defects. There is also a high density of stacking faults near the branch defects at x=0.31, which suggests that the branch defect strain fields are tensile.

To study the branch defects that dominate relaxation in series I described heretofore, samples were graded to x~0.33 with a range of growth temperatures under otherwise identical conditions (series II). FIG. 7 is a table of materials characterization results for series II: In$_x$Ga$_{1-x}$P/GaP graded to x~0.33. All samples have a clear surface crosshatch pattern and, except for the sample grown at 810° C., have specular surfaces. The quantitative indicators of material quality listed in the table of FIG. 7 degrade rapidly with increasing growth temperature. The increase in $\rho_{overall}$ correlates strongly with increases in $\rho_{pileup}$ and $R_q$. The sample at 810° C. is essentially polycrystalline and proved difficult to fully characterize.

Figure 8A:
FIGS. 8A and 8B are PVTEM images of $In_xGa_{1-x}P/GaP$ graded to x~0.33 at 700° C. and 760° C., respectively.
Figure 8B:

Branch defects are present in all of the samples in this series. At 760° C., the branch defects have the same density and general appearance as those in series I, but the branches themselves are stronger and sharper. The branch defects look very different at 700° C. FIGS. 8A and 8B are PVTEM images of In$_x$Ga$_{1-x}$P/GaP graded to x~0.33 at 700° C. and 760° C., respectively. The difference in defect density is very striking, with the sample grown at 760° C. possessing a high density of dislocations and stacking faults. The branch defect is much sharper and stronger in the sample grown at 760° C. compared to 700° C. FIGS. 8A and 8B show that the branches are weak, diffuse, and broad at 700° C. compared to 760° C. The branching nature is also less pronounced and the branch defects appear as long <011> stripes with transverse $\rho_{branch}$=7621 cm$^{-1}$ and an axial $\rho_{branch}$ that is too low to measure. The branch defects are very faint for g=<004> and do not strongly affect bend contours, which suggests that the branch defects possess less strain at 700° C. than at 760° C.

Branch defects strongly pin dislocations in the sample grown at 760° C., resulting in a very high density of pileups. While pileups are present, at 700° C., the weaker branch defects do not appear to pin dislocations as strongly as at 760° C. The resulting differences in defect density are strikingly evident in FIGS. 8A and 8B.

CL of the sample grown at 700° C. shows a low density of dislocation pileups compared to samples grown at higher temperatures. The samples grown above 700° C. are too rough and defective to obtain clear CL images, but the defect density is high enough to measure accurately with PVTEM alone.

Speculating that optimal growth conditions would vary with composition, samples were graded to x~0.1 with a range of growth temperatures under otherwise identical conditions (series III). All of the samples in this series have specular surfaces with very faint crosshatch. FIG. 9 is a table of materials characterization results for series III: $In_xGa_{1-x}P/GaP$ graded to x~0.1. The table of FIG. 9 shows that material quality degrades steadily with decreasing growth temperature.

Figure 10:
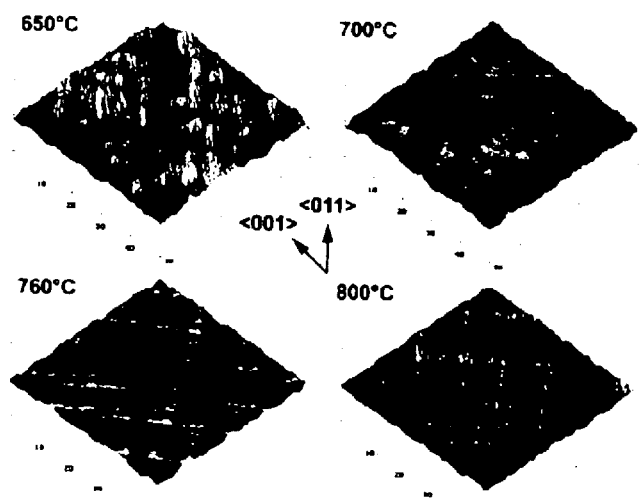
FIG. 10 are AFM images of $In_xGa_{1-x}P/GaP$ graded to x~0.1.

The trend in $R_q$ does not fully reflect the change in surface morphology, which FIG. 10 shows changes from a smooth, ordered crosshatch to a cellular, disordered structure with decreasing growth temperature. The samples grown below 760° C. are too rough to quantitatively analyze crosshatch with AFM. FIG. 10 are AFM images of $In_xGa_{1-x}P/GaP$ graded to x~0.1. All scans cover an area of $(50 \mu m)^2$ with a vertical scale of 200 nm/division. The transition from a rough, cellular surface to a smooth, crosshatch surface suggests that relaxation becomes more efficient as growth temperature increases.

FIGS. 11A and 11B are PVTEM images of $In_xGa_{1-x}P/GaP$ graded to x~0.1 at 650° C. and 760° C., respectively. The weak and closely spaced branch defects in the sample grown at 650° C. appear to hinder dislocation glide, resulting in dislocation pileups parallel to the branches. There are no traces of branch defects or dislocation pileups in the sample grown at 760° C. The PVTEM images in FIGS. 11A and 11B illustrate the change in microstructure with growth temperature. Branch defects oriented in one <011> direction are present in samples grown below 760° C. At 650° C., $\rho_{branch}$=26911 cm$^{-1}$ and the branch defects are visible for both g=<022> and g=<004>. At 700° C., $\rho_{branch}$=9808 cm$^{-1}$ and the branch defects are nearly invisible for g=<022> and are not seen for g=<004>. The branch defects appear in AFM as 3 nm ridges at 650° C., while no related topography can be resolved at 700° C. FIGS. 11A and 11B show that branch defects and dislocations interact at 650° C., resulting in pileups parallel to the branch defects. The much weaker branch defects at 700° C. do not appear to interact with dislocations and PVTEM shows very few pileups. In general, the branch defects are much weaker in appearance and pin dislocations less effectively than in series I and II.

FIGS. 11A and 11B also show that branch defects are not seen in the samples grown above 700° C. Consequently, pileups are not seen and the change in defect density with growth temperature is less dramatic than at lower temperatures. The microstructure of the samples grown at 760° C. and 800° C. are qualitatively similar, with the latter sample having better quantitative materials properties.

With the understanding of the temperature dependence of material quality at x~0.33 and x~0.1 gained in series II and III, respectively, growth temperature was optimized as a function of composition (series IV). The result is that the optimized 650° C. sample has the lowest $\rho_{overall}$ of any sample graded to x>0.25, despite being graded up to x~0.39. The relevant data are summarized in the table of FIG. 12. FIG. 12 is a table of materials characterization results for series IV: $In_xGa_{1-x}P/Gap$ graded to x~0.33 with growth temperature optimization.

FIGS. 13A and 13B are PVTEM and CL images, respectively, of $In_xGa_{1-x}P/GaP$ graded to x~0.33 with growth temperature optimized as a function of composition. The long horizontal features in the PVTEM image are branch defects and the fine vertical features are growth supersteps. The branch defects appear to slow dislocation glide, as evidenced by the light dislocation pileup that appears parallel to the branches. The black dots in the CL image are due to strong non-radiative trapping by individual threading dislocations. The larger scale afforded by CL imaging shows that the dislocation distribution is nearly homogeneous and pileup formation is very light.

FIGS. 13A and 13B show that the microstructure is dominated by a high density of branch defects, but the dislocation density is low and relatively homogeneous. The branch defects are weak and only visible for g=<022>. As in series III at 650° C., the branch defects appear as ridges in AFM. The branch defects appear to hinder dislocation glide, but do not strongly pin dislocations, so pileups are weak and infrequent in both PVTEM and CL images. While $\rho_{pileup}$ is low, the biggest difference is that $\rho_{linear}$ is more than an order of magnitude lower than any sample in series I or II.

The dramatic increase in $\rho_{overall}$ between x=0.26 and x=0.31 supports the speculation that the degradation of $In_xGa_{1-x}P/GaP$ LED efficiency beyond 600 nm is due to increasing dislocation density with continued grading. As noted earlier, graded buffer relaxation models predict a nearly steady-state $\rho_{overall}$. Both microscopic and macroscopic evidence will show that branch defects are responsible for the escalation of defect density with continued grading.

The increase in $\rho_{overall}$ with continued grading correlates strongly with pileup formation. In both samples, approximately 60% of the total threading dislocations are trapped in pileups. This agrees with observations of the $Ge_xSi_{1-x}/Si$ system, where increasing $\rho_{overall}$ is due to increasing pileup formation.

While surface roughness is the primary cause of pileups in $Ge_xSi_{1-x}/Si$, most of the pileups observed in series I occur on or near branch defects, which have not been observed in $Ge_xSi_{1-x}/Si$. Branch defects pin individual dislocations even at x~0.26 and $\rho_{pileup}$ increases with continued grading while $\rho_{branch}$ remains constant, so branch defects clearly precede pileups. Branch defect topography is gentle and overall surface roughness is very low at x=0.26, so the sharp branch defect strain fields appear to be responsible for dislocation pinning.

Branch defects clearly dominate dislocation dynamics at the microscale, but the sampling area of TEM is too small to provide conclusive evidence that branch defects are the primary cause of pileups at a macroscale. Indeed, the data show a correlation between surface roughness and defect density that qualitatively agrees with the pileup mechanism found in the $Ge_xSi_{1-x}/Si$ system. Examined quantitatively, the increase in $\rho_{overall}$ with $R_q$ in $In_xGa_{1-x}P/GaP$ is much more dramatic than expected, which suggests that something other than surface roughness dominates relaxation, namely the branch defects.

Relaxation modeling confirms on a macroscale that branch defects are responsible for the escalation of defect density with continued grading in $In_xGa_{1-x}P/GaP$. The expected change in $\rho_{overall}$ between x=0.26 and x=0.31 can be calculated by assuming that dislocation pinning by the branch defects dominates relaxation. First, the misfit dislocation density, $\rho_{misfit}$, necessary in each <110> direction is given by:

$$\rho_{misfit} = \frac{\Delta a_0}{a_0} \cdot \frac{2\sqrt{2}}{a_0} \tag{1}$$

For the lattice-mismatch between x=0.26 ($a_0$=5.5593 Å) and x=0.31 ($a_0$=5.5802 Å), the calculation yields $\rho_{misfit}$=1.9× $10^5$ cm$^{-1}$. Each misfit dislocation can be assumed to terminate with two threading dislocations, so the $\rho_{overall}$ is twice $\rho_{misfit}$ divided by the average misfit dislocation glide length, L. The branch defects strongly pin dislocations, so L can be set equal to the inverse of $\rho_{branch}$ in each <110>. So, the $\rho_{overall}$ is expressed as:

$$\rho_{overall} = \frac{2\rho_{misfit}}{L_{\langle 110 \rangle}} + \frac{2\rho_{misfit}}{L_{\langle 110 \rangle}} \tag{2}$$
$$= 2\rho_{misfit}(\rho_{branch}^{transverse} + \rho_{branch}^{axial})$$

Using the average values of transverse and axial $\rho_{branch}$ in series I, the result is $\rho_{overall}$=2.4×$10^9$ cm$^{-2}$. This calculated value is much larger than the observed $\rho_{overall}$ at x=0.31, because all branch defects are assumed to strongly pin dislocations, which is certainly inaccurate otherwise $\rho_{pileup}$ would equal $\rho_{branch}$. Recalculation assuming that only branch defects with strong wavy interference contrast in XTEM effectively pin dislocations results in $\rho_{overall}$=2.2× $10^8$ cm$^{-2}$, which agrees very well with the measured value.

The model analysis suggests that dislocation pinning is proportional to branch defect strength and that pileups caused by strong branch defects ultimately limit how far In$_x$Ga$_{1-x}$P/GaP can be graded before serious material degradation occurs. Unfortunately, the limit to grading occurs near the indirect-direct bandgap transition at x~0.27 where InGaP becomes useful for efficient, direct bandgap devices. Similar grading limits have also been observed at x~0.35 in HVPE and x~0.32 in GSMBE. Clearly, branch defects must be eliminated or suppressed to achieve high-quality device materials.

Series I shows that branch defects dominate relaxation in samples grown at 760° C. Varying growth temperature in series II dramatically changes both branch defect density and strength. Correspondingly, material properties degrade rapidly with increasing temperature, in particular between 700° C. and 760° C. Analysis of the results will show that the material properties are dominated by the temperature dependence of the branch defects.

Since $\rho_{branch}$ increases with decreasing growth temperature, L would decrease and both $\rho_{overall}$ and $\rho_{pileup}$ would increase with decreasing temperature if the branch defects continued to strongly pin dislocations. The results show the opposite trend: $\rho_{overall}$ and $\rho_{pileup}$ decrease dramatically with decreasing temperature, so the ability of branch defects to pin dislocations must decrease with temperature. Branch defect diffraction contrast and strain fields seen in TEM are markedly weaker at lower temperatures, which suggests that dislocation pinning is proportional to the strength of branch defects.

Suppression of branch defects at 700° C. minimizes pileup formation and controls the escalation Of $\rho_{overall}$ with continued grading, compared to higher growth temperatures. Note that the sample grown at 700° C. was graded farther than any sample grown at 760° C., yet retains a much lower $\rho_{overall}$. Pileups still occur, but they are weaker and more widely spaced than at 760° C., hence the escalation of $\rho_{overall}$ with grading is moderate.

The sample grown at 760° C. shows significant degradation compared to series I. While $\rho_{branch}$ is nominally identical in all of the samples grown at 760° C., branch defects are much stronger in series II. Since the measured $\rho_{overall}$ matches the value calculated assuming all branch defects pin dislocations in the analysis of series I, it appears that most of the branch defects in the sample grown at 760° C. in series II pin dislocations. This further supports the observations that branch defects dominate relaxation in In$_x$Ga$_{1-x}$P/Ga at 760° C. and that dislocation pinning is proportional to branch defect strength.

The only difference between the samples graded to x=0.31 in series I and series II is the grading rate profile. The variable grading rate profile used in series I produces higher strain rates at low indium compositions and lower strain rates at high indium compositions, compared to the constant grading rate profile in series II. Two general observations can be made: lower indium compositions appear to be less sensitive to strain rate and the strength, but not density, of branch defects is sensitive to the strain rate.

The sample grown at 810° C. should have strong and widely spaced branch defects, according to the observed temperature dependence of branch defect morphology. Branch defect spacing does not appear to increase enough to compensate for the increase in branch defect strength at 810° C. The extreme roughness of the sample makes characterization difficult, but it appears that the branch defects are so strong that the material becomes essentially polycrystalline when graded up to x~0.33.

The temperature dependence of branch defect morphology suggests two options for minimizing the impact of branch defects on dislocation dynamics: increase temperature to increase branch defect spacing or decrease temperature to decrease branch defect strength. The results show that decreasing growth temperature to suppress branch defects is the effective strategy for producing high-quality material. It is also apparent that reducing grading rate at higher indium compositions can further suppress branch defect strength. As branch defects are suppressed, $\rho_{overall}$ approaches the nearly steady-state behavior predicted by ideal relaxation models.

Series I and II show that branch defects dominate relaxation in In$_x$Ga$_{1-x}$P/GaP. Relaxation approaches the ideal behavior expected from a model based on dislocation kinetics as the branch defects are suppressed. Series III shows that branch defects can be eliminated altogether at x~0.1, and analysis will show that the resulting relaxation behavior is dominated by the kinetics of dislocation glide.

Figure 14:
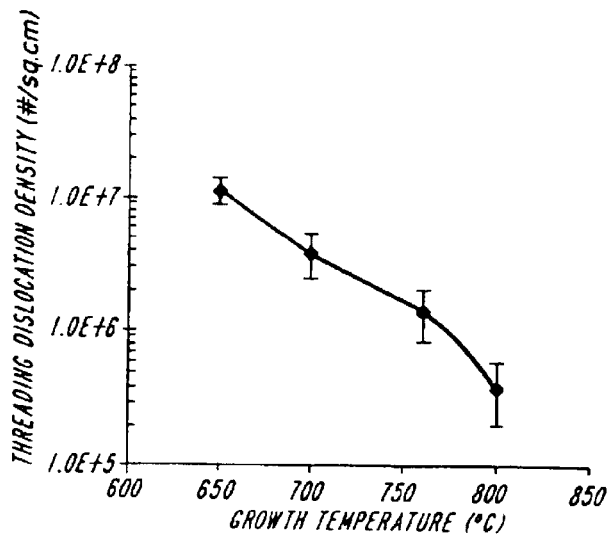
FIG. 14 is a graph showing a plot of $\rho_{field}$ versus growth temperature for $In_xGa_{1-x}P/GaP$ graded to x~0.1.

Branch defects are essentially absent in all of the samples, except for the sample grown at 650° C. where weak branch defects and pileups are observed. Without the influence of branch defects on dislocation dynamics, the resulting temperature dependence of $\rho_{field}$ shown in FIG. 14 is the opposite of that seen in series II. FIG. 14 is a graph showing a plot of $\rho_{field}$ versus growth temperature for In$_x$Ga$_{1-x}$P/GaP graded to x~0.1. The steady decrease in $\rho_{field}$ with increasing temperature is opposite the trend seen in series II due to the diminished role of branch defects at x~0.1. Clearly, relaxation is very different when branch defects are not active.

The temperature dependence of the (004) Bragg peak width, $\beta_{(004)}$, is also the opposite of that observed in series II. Degradation of crystallinity with decreasing temperature could hinder dislocation glide and result in increasing defect density, but analysis of $\beta_{(004)}$ versus $\rho_{field}$ indicates that the opposite is true: the measured Bragg peak broadening is a result of increasing $\rho_{field}$ and not vice versa.

Bragg peak broadening due to dislocations, $\beta_{dis}$, can be expressed as a function of Bragg angle, $\theta_B$:

$$\beta_{dis} = K_\alpha + K_\epsilon \tan^2 \theta_B \tag{3}$$

The coefficients are functions of the Burgers vector, b, and $\rho_{field}$:

$$K_\alpha = 4.36 b^2 \rho_1 \quad (4)$$

$$K_\epsilon 0.090 b^2 \rho_{thread} |ln(2 \times 10^{-7} \text{ cm } \sqrt{\rho_{thread}})| \quad (5)$$

$\beta_{(004)}$ is expressed as the sum of the intrinsic Bragg peak width of the material, $\beta_0$, the broadening due to the instrument, $\beta_{instr}$, and the broadening due to dislocations, $\beta_{dis}$:

$$\beta_{(004)}^2 = \beta_0^2 + \beta_{instr}^2 + \beta_{dis}^2 \quad (6)$$

Figure 15:
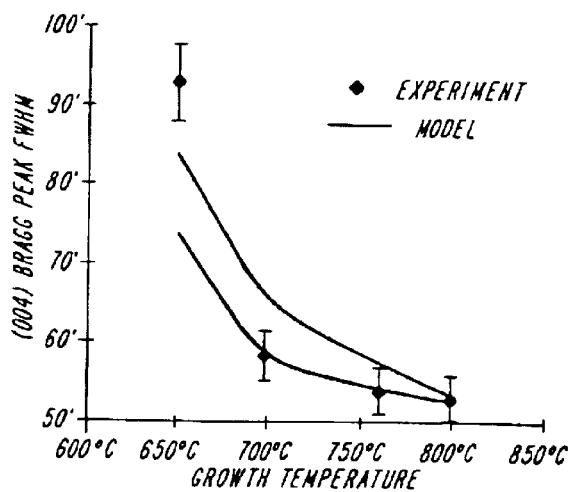
FIG. 15 is a graph showing a plot of (004) Bragg peak FWHM versus growth temperature for $In_xGa_{1-x}P/GaP$ graded to x~0.1.

$\beta_{instr}$ is a constant throughout this series and $\beta_0$ can be assumed constant for an initial calculation. The sample grown at 800° C. can be used to calculate a baseline value for $\beta_0^2 + \beta_{instr}^2$, which is added to $\beta_{dis}^2$ calculated for each sample. The resulting model values for $\beta_{(004)}$ are plotted in FIG. 15 and agree very well with the measured data. FIG. 15 is a graph showing a plot of (004) Bragg peak FWHM versus growth temperature for $In_xGa_{1-x}P/GaP$ graded to x~0.1. The diamond points are measured values and the dashed lines are calculated from measured $\rho_{field}$ values. Two dashed lines are plotted to reflect the error bars in the $\rho_{field}$ values used in the calculations. The disagreement between experiment and theory at 650° C. is due to significant dislocation pileup formation.

The agreement between the measured and modeled $\beta_{(004)}$ values indicates that Bragg peak broadening in series III is primarily due to dislocations. The moderate disagreement at 650° C. is due to pileup formation at that temperature. Rigorously, $\rho_{overall}$ should be used instead of $\rho_{field}$, but $\rho_{overall}$ and $\rho_{field}$ are used interchangeably in series III because pileup formation is insignificant above 650° C. The value of $\rho_{overall}$ is typically twice $\rho_{field}$ in samples exhibiting significant pileup formation and doubling the of $\rho_{field}$ value used in the calculation of $\beta_{(004)}$ at 650° C. results in good agreement with the measured value.

The observed surface roughness is also far too low to affect dislocations in series III. The typical effective critical thickness, or dislocation-free thickness, in these experiments is on the order of $10^3$ Å, while the worst surface undulations are an order of magnitude smaller. Also, the change in $R_q$ with temperature is very moderate. Any interaction between dislocations and the surface should be weak.

With the absence of microstructural features that interact with dislocations, the kinetics of dislocation nucleation and glide should control relaxation. The observed temperature dependence of $\rho_{field}$ is consistent with the behavior expected if relaxation was limited by dislocation glide kinetics: as temperature decreases, decreasing dislocation glide kinetics force the nucleation of a higher density of dislocations to maintain efficient strain relaxation, so $\rho_{field}$ increases. If relaxation was limited by dislocation nucleation, then $\rho_{field}$ would decrease with decreasing growth temperature.

Relaxation modeling quantitatively demonstrates that dislocation glide kinetics dominate relaxation in series III. Assuming relaxation is isotropic in the two <011>, the relaxation rate, δ, can be expressed as:

$$\delta = \frac{\rho_{field} v b}{4} \quad (7)$$

The dislocation glide velocity, v, is empirically expressed as:

$$v = A \left(\frac{\tau}{\tau_0}\right)^n \exp\left(-\frac{E_{glide}}{kT}\right) \quad (8)$$

A and n are materials constants, $E_{glide}$ is the dislocation glide activation energy, τ is the resolved shear stress, and $\tau_0$ is constant equal to 1 MPa. It is reasonable to assume that the residual strain reflects the steady-state strain in the pseudomorphic film at the surface of the graded buffer during growth and TAXRD results show that residual strain does not vary significantly with temperature in series III. Therefore, τ can be considered constant in series III, especially since n~1 and any moderate variations in τ are overwhelmed by the exponential term.

The nearly constant residual strain in this series also suggests that δ is the same in all of the samples. Therefore, $\rho_{field}$ can be expressed as:

$$\rho_{field} = \frac{4\delta}{b} \cdot \frac{1}{v} = c \exp\left(\frac{E_{glide}}{kT}\right) \quad (9)$$

$E_{glide}$ can be determined by measuring the slope in a plot of $\ln(\rho_{field})$ versus 1/T:

$$\ln \rho_{field} = \ln c + \frac{E_{glide}}{kT} \quad (10)$$

Figure 16:
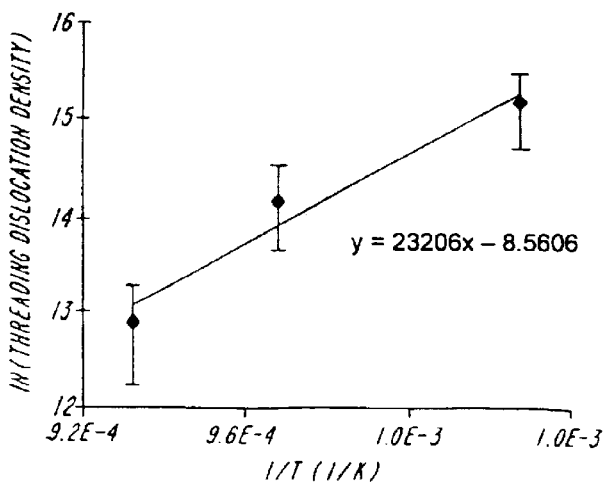
FIG. 16 is a graph showing a plot of $\ln(\rho_{field})$ versus 1/T for $In_xGa_{1-x}P/GaP$ graded to x~0.1 at 800° C., 760° C., and 700° C.

FIG. 16 is a graph showing a plot of $\ln(\rho_{field})$ versus 1/T for $In_xGa_{1-x}P/GaP$ graded to x~0.1 at 800° C., 760° C., and 700° C. The activation energy calculated from the slope is 2.0 eV, which is in good agreement with the average value of 1.8 eV for the activation energy of dislocation glide for α and β dislocations in GaP and InP. This result suggests that strain relaxation at x~0.1 is dominated by the kinetics of dislocation glide. The measured slope corresponds to $E_{glide}$ = 2.0 eV, which is in fair agreement with published values for $E_{glide}$ in GaP and InP: 1.45 eV for α dislocations and 1.68 eV for β dislocations in GaP, 1.6 eV for α dislocations and 2.3 eV for β dislocations in InP. Measured values for dislocation glide kinetics also vary with electronic and isoelectric doping, so doped graded buffers will have slightly different dislocation dynamics and doping levels must be controlled to achieve high-quality materials.

This two parameter model shows that the temperature dependence of $\rho_{field}$ is consistent with the thermal activation energy of dislocation glide. The model simplifies relaxation by assuming that dislocation glide is entirely rate-limiting and that relaxation is isotropic. A more complex model can be derived, but such analysis does not provide additional insights given the size and resolution of the current data set.

Figure 17:
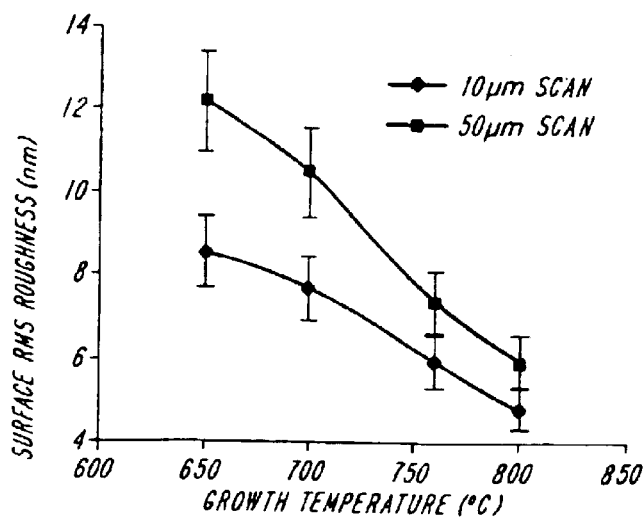
FIG. 17 is a graph showing a plot of surface RMS roughness versus growth temperature for $In_xGa_{1-x}P/GaP$ graded to x~0.1.

The dominance of dislocation glide kinetics at x~0.1 is also apparent in the temperature dependences of surface morphology. A smooth, regular crosshatch surface is indicative of efficient relaxation by dislocation glide, so the transition from cellular to crosshatch surface morphology shown in FIG. 10 suggests that efficient relaxation only occurs at high growth temperatures. It could be speculated that since crosshatch is the response of the growth surface to dislocation strain fields, the change in surface morphology is due to decreasing surface diffusivity. If diffusivity was primarily responsible for the change in surface morphology, the surface would become smoother with decreasing temperature, which FIG. 17 shows is not the case at x~0.1. FIG. 17 is a graph showing a plot of surface RMS roughness versus growth temperature for $In_xGa_{1-x}P/GaP$ graded to x~0.1. Scan areas of $(10 \mu m)^2$ and $(50 \mu m)^2$ were used to ensure that both small and large scale roughness were measured. So, while surface diffuisivity certainly changes with temperature, the observed trends are not consistent with a surface morphology dominated by those changes in surface diffusivity.

Figure 18:
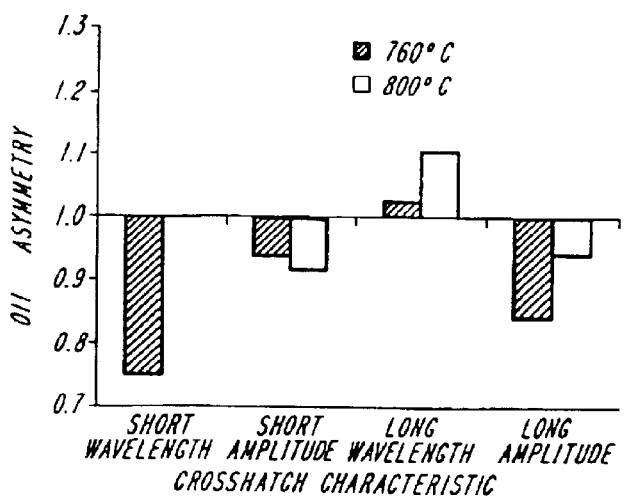
FIG. 18 is a graph showing a plot of the ratio between the two in-plane <011> directions for crosshatch wavelength and amplitude, as measured by AFM in $In_xGa_{1-x}P/GaP$ graded to x~0.1 at 760° C. and 800° C.

Analysis of crosshatch wavelength and amplitude in the samples grown at 760° C. and 800° C. also indicates that dislocation glide kinetics dominate relaxation for x~0.1. Relaxation in strained III-V compound semiconductors is asymmetric due to the differences between α and β dislocation. If relaxation is controlled by dislocation glide kinetics, the crosshatch pattern is expected to be asymmetric in the in-plane <011> directions. Since dislocation glide kinetics are thermally-activated, relaxation should also become more symmetric with increasing growth temperature. FIG. 10 and FIG. 18 show that crosshatch wavelength and amplitude are qualitatively and quantitatively asymmetric in both samples and that crosshatch becomes more symmetric at higher temperatures. FIG. 18 is a graph showing a plot of the ratio between the two in-plane <011> directions for crosshatch wavelength and amplitude, as measured by AFM in $In_xGa_{1-x}P$/GaP graded to x~0.1 at 760° C. and 800° C. The long and short designations refer to the two distinct wavelengths observed in frequency spectrum analysis of the crosshatch surface. The crosshatch is more symmetric in the sample grown at higher growth temperature.

Although quantitative crosshatch data are unavailable for the samples grown at 650° C. and 700° C., examination under DIC suggests that the same trends continue down to 650° C. These results show that surface morphology and relaxation are controlled primarily by dislocation glide kinetics.

The analysis of series III demonstrates that dislocation glide kinetics dominate relaxation and microstructure in $In_xGa_{1-x}P$/GaP, in the absence of external or heterogeneous hindrances to dislocation dynamics such as branch defects. The branch defects at 650° C. are so weak and closely spaced that they can be considered an effective drag force on dislocation glide, hence their effect on dislocation mobility is complimentary to that of decreasing temperature. As noted earlier in this section, the temperature dependence of defect density depends on whether relaxation is limited by dislocation nucleation or glide kinetics, therefore determining that dislocation glide kinetics dominate relaxation is critical for the rational design of high-quality graded buffers.

The results of series II and III taken together show that a constant growth temperature is not optimal, since the temperature dependence of material quality at x~0.1 is the opposite of that seen at x~0.33. While 700° C. appears to be a reasonable compromise, growth temperature should be optimized as a function of composition to obtain higher quality $In_xGa_{1-x}P$/GaP. The superior material quality of the optimized sample illustrates the effectiveness of even a simple growth temperature optimization.

Series II suggests that decreasing growth temperature should improve material quality, but series III shows that $\rho_{field}$ reaches $1.2 \times 10^7$ cm$^{-2}$ by x~0.1 at 650° C. An intuitive approach is to use the best growth temperature for each composition range: high growth temperature at low indium compositions and low growth temperature at high indium compositions. The results show that optimization suppresses branch defects and limits the degradation with continued grading seen in series I. Grading was continued Δx=0.05 beyond the sample grown at 700° C. in series II, yet the resulting defect densities are lower. With respect to the sample grown at 760° C. in series III, $\rho_{overall}$ only increases from $1.1 \times 10^6$ cm$^2$ to $4.7 \times 10^6$ cm$^2$ for Δx=0.28. There is still pileup formation, so the $\rho_{overall}$ would have been even lower if grading had been stopped earlier.

Figure 19:
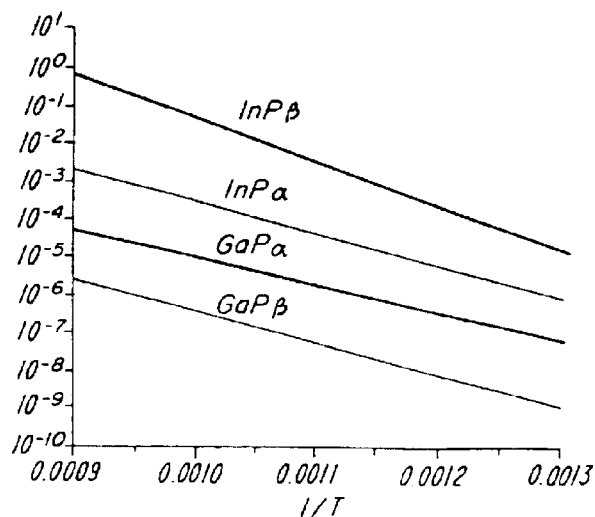
FIG. 19 is a graph showing a plot of dislocation glide velocity versus 1/T for α and β dislocations in GaP and InP.

The results also show that dislocation glide mobility must increase with indium composition, otherwise dropping the growth temperature to 650° C. should result in $\rho_{overall} \geq 1.2 \times 10^7$ cm$^{-2}$ according to the results of series III. Dislocation glide kinetics have not been studied systematically in $In_xGa_{1-x}P$, but the general composition dependence can be inferred from available data. FIG. 19 shows that dislocation glide velocities are several orders of magnitude greater in InP than in GaP. FIG. 19 is a graph showing a plot of dislocation glide velocity versus 1/T for α and β dislocations in GaP and InP. A shear stress of 1 MPa was used for the calculations. Dislocations in InP glide several orders of magnitude faster than those in GaP.

Figure 20:
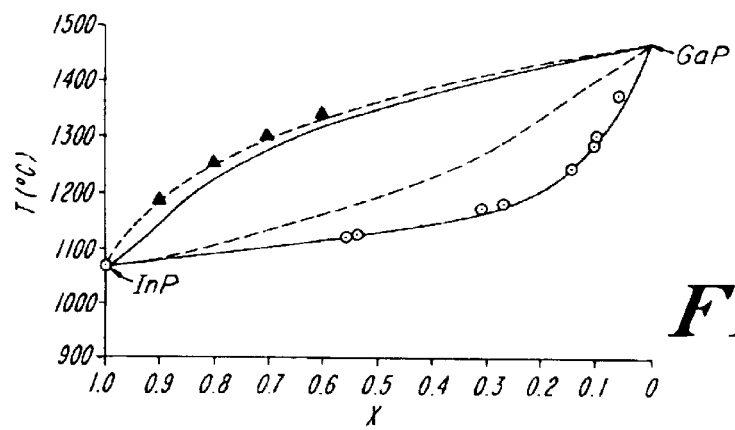
FIG. 20 is an equilibrium phase diagram for $In_xGa_{1-x}P$.

FIG. 20 is an equilibrium phase diagram for $In_xGa_{1-x}P$. The solidus temperature drops mostly between x=0 and x=0.3, which suggests that materials properties should change dramatically in that composition range. The $In_xGa_{1-x}P$ phase diagram in FIG. 20 shows that most of the change in solidus temperature occurs between x=0 and x=0.3, so most of the change in materials properties between GaP and InP should occur in that range. Therefore, dislocation glide kinetics should increase by orders of magnitude between x=0 and x=0.3. Since relaxation is limited by dislocation glide kinetics in the absence of branch defects, the faster kinetics at x=0.2 allow growth temperature to be dropped to 650° C. without increasing $\rho_{overall}$ to the high value seen in series III.

The optimized sample shows that changing growth temperature as a function of composition results in improved material quality. Dislocation glide kinetics set a lower limit for defect density, but glide kinetics increase with indium composition and allow growth temperature to be dropped to control branch defects. Further optimization requires a better understanding of the evolution of branch defects.

The effect of the branch defects on relaxation is clear: branch defects interact with dislocations to pin or slow glide, resulting in increased $\rho_{pileup}$ and $\rho_{overall}$ The results of series II, III, and IV illustrate how branch defects can be eliminated or suppressed to minimize their effect on relaxation. Additional progress depends on understanding the mechanisms of branch defect formation.

Several basic properties of branch defects can be observed directly. TEM shows that the branch defects are crystallographic features that can contain sharp tensile strain fields. Although AFM and XTEM reveal that branch defects form very shallow cusps at the surface, they appear to hinder or pin dislocations primarily through their strain fields. Strong branch defects may also act as low activation energy sites for heterogeneous dislocation nucleation, but such an effect is difficult to identify.

The evolution of branch defects can also be followed empirically. The formation and development of branch defects appears to be primarily controlled by growth temperature. Evaluation of all the available data reveals strong temperature dependencies for branch defect formation, strength, and density.

The onset of branch defect formation varies with growth temperature. At 760° C., branch defects are completely absent at x=0.11 and are present at x=0.26, so they must form somewhere between those two compositions. The relatively low $\rho_{overall}$ at x=0.26 in series I indicates that branch defect formation must begin close to x=0.26. XTEM of the same sample shows that branch defects only penetrate the last several steps of the graded buffer. Overall, branch defects appear to form at x~0.2 for a growth temperature of 760° C. At 700° C., the beginning of branch defect formation can be seen at x=0.09 in series I, so branch defects form at x~0.1 for a growth temperature of 700° C. At 650° C., well developed branch defects are already present at x=0.15. Given the trend seen between 760° C. and 700° C., branch defects probably appear at x<0.1 for a growth temperature of 650° C. Although indium composition is used to describe the onset of branch defect formation, the current data cannot be used to differentiate whether branch defect formation depends on composition or total film thickness since the same grading rate was used in all of the samples.

Branch defect strength also varies with temperature. Series II and IV show that branch defects become stronger with increasing temperature. Series III appears to show the opposite trend, but this is due to the temperature dependence of branch defect formation: at x~0.1, branch defects in the samples grown at lower temperature have formed and evolved further than in samples grown at higher temperature. This indicates that although the onset of branch defect formation occurs later with increasing temperature, branch defect strength develops much more rapidly at higher temperatures.

Comparison of the samples graded to x=0.31 at 760° C. in series I and II shows that grading rate also affects the strength of branch defects. The constant grading rate profile has a higher grading rate at high indium compositions that the variable grading rate profile, which results in much stronger branch defects. Decreasing grading rate with increasing composition appears to suppress the branch defects.

Figure 21:
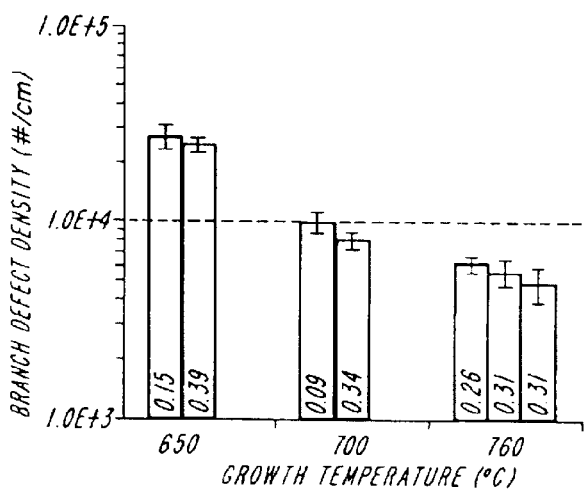
FIG. 21 is a graph showing a plot of $\rho_{branch}$ versus growth temperature for all samples that exhibit branch defects.

Branch defect density is also primarily a function of growth temperature. FIG. 21 is a graph showing a plot of $\rho_{branch}$ versus growth temperature for all samples that exhibit branch defects. The final indium composition is inset in the bar for each sample to illustrate that branch defect density is primarily a function of growth temperature, but also appears to have a weaker composition dependence. FIG. 21 shows that $\rho_{branch}$ decreases exponentially with increasing temperature. There is also a weaker dependence on composition, $\rho_{branch}$ decreases with increasing composition. Increasing indium composition reduces the solidus temperature, which is analogous to increasing growth temperature at a fixed composition. Both trends therefore suggest that branch defect density is determined by a thermally-activated process.

The precise nature and formation mechanism of branch defects are currently unclear. The branch defects themselves are difficult to isolate and quantitatively characterize. Nevertheless, several possibilities can be eliminated with analysis. Three known phenomena appear similar to branch defects: strain-relieving surface undulations, antiphase boundaries (APBs), and phase separation. Careful analysis of the experimental evidence shows that none of these phenomena are likely to be responsible for branch defects in $In_xGa_{1-x}P/GaP$.

The branch defects are not the cusps of strain-induced surface undulations. The branch defect density does not match any period of the ubiquitous strain-induced crosshatch pattern. There is also no reason that surface undulations would occur in only one <011>. Furthermore, the topography of the branch defects does not relieve strain. Strain-relieving surface undulations in a compressive film feature compressive strain in the valleys and tensile strain in the peaks, but branch defects form valleys with intense tensile strain.

Branch defects are not APBs because they do not enclose and separate domains of different microstructure. Furthermore, no reported antiphase mechanism is consistent with the observed branch defects. The APBs due to sub-lattice displacement found in heteropolar epitaxy are not expected for homopolar $In_xGa_{1-x}P$ growth on GaP. APBs between atomically ordered domains have been reported extensively in $In_{0.48}Ga_{0.52}P$ grown on GaAs, but branch defects become stronger with increasing temperature, while ordering becomes weaker with increasing temperature and is almost completely absent at 760° C.

Branch defects also do not appear to be consistent with phase separation. It has been shown theoretically that there is no driving force for phase separation in InGaP when coherency strain is considered, but phase separation could be induced by the strain fields present in a graded buffer. If the branch defects were due to strain-induced phase separation, then their periodicity should correspond to the strain fields present in the graded buffer. Since all of the graded buffers are nearly completely relaxed, the strain fields in all of the samples should be very similar and result in a constant $\rho_{branch}$. The strong temperature dependence of $\rho_{branch}$ shows that branch defect formation is not dominated by dislocation strain fields.

The morphology of branch defects also does not appear likely to relieve strain by phase separation. The strain fields observed in branch defects are very strong and sharp, so any strain that they might relieve should also be similarly strong and sharp. The crosshatch morphology and recent strain field modeling both show that dislocation strain fields are quite gentle at the growth surface, so the branch defect morphology is not consistent with strain-induced phase separation at the surface. Strain fields are strong and sharp close to misfit dislocations, but those dislocations are separated from the growth surface by the critical thickness. Strain-induced phase separation near the buried misfit dislocations would rely on very slow solid diffusion and the resulting features would not extend to the surface, but XTEM shows that branch defects do indeed emerge at the growth surface. Furthermore, the branch defects appear in only one <110>, while dislocation strain fields are arrayed in both <110>. Therefore, the morphology of branch defects is not consistent with strain-induced phase separation at the surface or at the buried misfit dislocation network.

There are also no direct indications of phase separation in the data. Preliminary EDS studies in both STEM and SEM show no evidence of phase separation near branch defects, which suggests that any compositional variations are less than 1%. Room temperature CL spectra do not show any unusual features that could be attributed to phase separation. Overall, there is currently no empirical evidence that the branch defects are due to strain-induced phase separation.

Overall, the general empirical behavior of branch defects depends primarily on growth temperature. The formation mechanism for branch defects is still unclear, but the temperature dependence of branch defect density suggests that it is a kinetic process. Further characterization and analysis of branch defects will be presented in a later publication.

There is no reason to expect that branch defects are unique to $In_xGa_{1-x}P/GaP$. A survey of the literature suggests that branch defects could explain the material degradation commonly observed in arsenides and phosphides containing indium grown near 575° C. by both MBE and MOVPE. Combined with the results of this study, a picture of the evolution of microstructure in these materials between roughly 400° C. to 800° C. will be proposed.

Material degradation as growth temperature approaches 575° C. has been reported in $In_xGa_{1-x}As/GaAs$ and $In_xGa_yAl_{1-x-y}As/GaAs$, as well as in lattice-matched $In_xGa_{1-x}As$ and $In_xGa_yAl_{1-x-y}As$ on InP. The properties observed to degrade in these reports include carrier mobility, PL intensity and peak width, Bragg peak width, and surface roughness. In particular, a consistent observation is that the surface degrades into <110> saw-tooth or ridge structures. A variety of mechanisms have been used to explain the roughening and degradation near 575° C. It has been proposed that indium desorption somehow results in degradation with increasing growth temperature. It has been alternatively proposed that the evolution of surface features was primarily a strain relaxation mechanism in $In_xGa_{1-x}As$/GaAs and that decreasing growth temperature kinetically limited surface roughening, resulting in good quality materials.

$In_xGa_{1-x}As$/GaAs grown by MOVPE from 500° C. to 700° C. has been studied and it has been found that degradation actually peaks near 550° C., with material quality improving at both lower and higher growth temperatures. In addition to the previously observed surface roughening, contrast modulation aligned primarily along one <110> was observed in PVTEM at 550° C. Similar features were also observed in $In_xGa_{1-x}As$/GaAs grown by MBE at 580° C., establishing a critical continuity between MBE and MOVPE work with $In_xGa_{1-x}As$/GaAs and indicating the earlier explanations for degradation at 575° C. were incomplete.

In recent work, it has been observed that the contrast modulation in $In_xGa_{1-x}As$/GaAs evolved into discrete defects that grew increasing far apart as growth temperature was increased. These defects featured wavy interference contrast and appeared to pin dislocations. It was believed that the defects were boundaries between domains of different surface reconstructions, since $In_xGa_{1-x}As$ undergoes a transition in surface reconstruction between 550° C. and 580° C. in MBE, so the defects were called "high-energy boundaries".

The behavior of "high-energy boundaries" parallels the behavior of branch defects in $In_xGa_{1-x}P$/GaP and the two phenomenon are probably equivalent. The degradation observed in $In_xGa_{1-x}As$/GaAs has indeed been also seen in $In_xGa_{1-x}P$ near 575° C. In $In_xGa_{1-x}P$/GaP grown by MBE, an increase in Bragg peak width near 575° C. has been observed. In lattice-matched $In_xGa_{1-x}P$ grown on GaAs by MOVPE, surface roughening and faceting at 580° C. versus the smooth surfaces obtained at 610° C. has been found, while strong degradation in PL intensity and peak width when growth temperature was decreased below 600° C. has been observed. Speculating that $In_xGa_{1-x}P$ has the same continuity between MBE and MOVPE results as demonstrated in $In_xGa_{1-x}As$/GaAs, these results suggest that strong degradation due to branch defects occurs in both materials systems near 575° C.

In addition to analysis and unification of earlier reports, the invention extends the understanding of the evolution of microstructure in $In_xGa_{1-x}P$ and $In_xGa_{1-x}As$. Surface ridges are only observed in the samples from series III and IV grown at the lowest growth temperature of 650° C. The quantitative correlation of surface ridges seen in AFM and branch defects seen in PVTEM shows that branch defects are directly responsible for the reported surface roughening near 575° C. Furthermore, series II shows that branch defects become stronger with increasing growth temperature, resulting in essentially polycrystalline materials above 760° C. Therefore, these two degradation phenomena define a high temperature process window between roughly 575° C. and 760° C. for the growth of high-quality $In_xGa_{1-x}P$ and a similar process window is expected in $In_xGa_{1-x}As$.

Also, a low temperature process window has been observed in MBE studies that extended down to extremely low growth temperatures. Material degradation in the $In_xGa_yAl_{1-x-y}As$ system has been reported below temperatures ranging from 300° C. to 450° C., while degradation was seen below 520° C. in $In_xGa_{1-x}P$/GaP. It is well known that a variety of kinetic factors result in poor material quality at extremely low growth temperatures, so the observed degradation temperatures are not surprising. Along with the degradation seen near 575° C., this very low temperature limit results in a low temperature process window for the growth of high-quality material.

Figure 22:
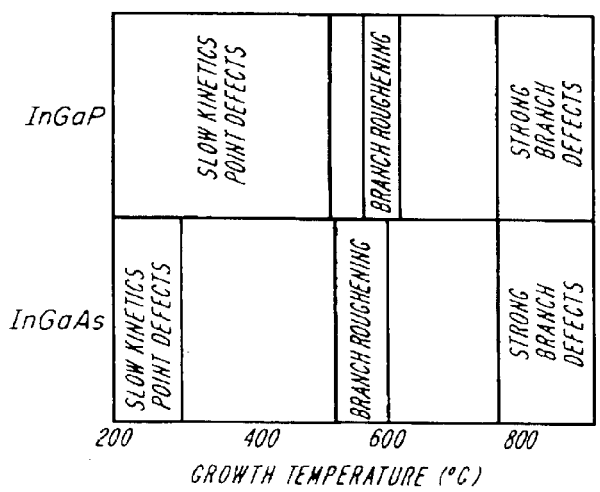
FIG. 22 is a graph showing approximate growth temperature process windows for the growth of $In_xGa_{1-x}P/GaP$ and $In_xGa_{1-x}As/GaAs$.

FIG. 22 is a graph showing approximate growth temperature process windows for the growth of $In_xGa_{1-x}P$/GaP and $In_xGa_{1-x}As$/GaAs. The white regions represent process windows for the growth of high quality material, while the shaded areas are regions of material degradation labeled with the mechanism responsible for the degradation. FIG. 22 illustrates the parallel process windows observed in $In_xGa_{1-x}P$ and $In_xGa_{1-x}As$, which are speculated as being dominated by the evolution of branch defects. At very high growth temperatures, branch defects are extremely strong and result in essentially polycrystalline material. Branch defect strength decreases with decreasing growth temperature, allowing high quality film growth. Below 600° C., increasing branch defect roughness and density produce severe material degradation. As growth temperature is decreased further, branch defects are suppressed and high quality film growth is again possible. At very low growth temperatures, extremely slow growth kinetics result in material degradation.

This analysis shows that the overall qualitative evolution of microstructure in $In_xGa_{1-x}P$ and $In_xGa_{1-x}As$ is strikingly independent of growth technique and whether the material is lattice-matched or mismatched. The very low temperature limit apparently varies significantly with the particular system being studied and the very high temperature limit may also vary as well, but the degradation observed at 575° C. is remarkably consistent. The mechanism for branch defect roughening is unclear at this time, but it must be something fundamental to the epitaxial growth of these materials.

If branch defects are indeed so universal, then it is surprising that they were not documented earlier. The study of the invention shows that branch defects evolve with continuing growth and are sensitive to strain, so it may be that branch defects are usually too weak to observe directly in most common lattice-matched heterostructures that are much thinner than the graded buffers in this study, although their effects are apparent in electrical and optical characterization. Also, much of the recent work in $In_xGa_{1-x}P$ and $In_xGa_{1-x}As$ has been conducted with MBE, which is inherently limited to the low temperature process window where branch defects are probably suppressed by slow kinetics.

Optimization is possible in either process window, but the results of series III show that the high temperature process window is capable of much lower defect densities. A rational optimization strategy for achieving device-quality materials should therefore concentrate on the high temperature process window. The understanding of branch defect evolution developed in the preceding analysis will prove critical to improving material quality in $In_xGa_{1-x}P$/GaP.

With the new understanding of dislocation dynamics in $In_xGa_{1-x}P$/GaP, the challenge is to formulate processes to achieve device-quality materials. Control over material degradation with continued grading up to x=0.39 has already been demonstrated in series II and IV, so it is reasonable to expect that the degradation of LED efficiency beyond x~0.35 can be avoided. Additional improvements in material quality depend on refining the understanding and control over dislocation kinetics and branch defects. Analysis of the current work and recent literature will be used to define an optimization strategy based on three primary design rules.

A kinetic relaxation model for graded buffers to describe the $Ge_xSi_{1-x}$/Si system has been proposed. Expressions derived for the activation energy of homogeneous dislocation nucleation were used to qualitatively describe heterogeneous dislocation nucleation. The essential observation was that dislocation nucleation is activated by both temperature and strain, or in other words, that dislocation nucleation is thermally-activated with an activation energy that is approximately inversely proportional to strain. Dislocation glide is also thermally-activated, but has only a power-law dependence on strain that is nearly linear, so dislocation glide has a much weaker strain dependence than dislocation nucleation. So, the dislocation nucleation rate and glide velocity can be expressed as:

$$\dot{\rho} \propto \exp\left(-\frac{E_{nucleation}}{\varepsilon \cdot kT}\right) \quad (11)$$

$$v \propto \varepsilon^n \exp\left(\frac{E_{glide}}{kT}\right) \quad (12)$$

High growth temperatures result in very rapid dislocation glide, which leads to low strain and hopefully suppresses dislocation nucleation. The implications of this model are clearer when a decrease in growth temperature is considered: dislocation glide slows exponentially, so strain increases. Strain would simply accumulate if the growth temperature were extremely low, otherwise the increase in strain should drastically increase dislocation nucleation and moderately increase dislocation glide until a steady-state is again achieved.

Series III is the first experimental demonstration of the kinetic graded buffer model. Comparing the linear and exponential strain dependences shown in Eq. (11) and Eq. (12), the dislocation glide velocity is essentially fixed by the growth temperature, while dislocation nucleation varies significantly with strain. Dislocation nucleation adjusts to provide the necessary $\rho_{field}$ to maintain efficient relaxation, as set by the dislocation glide velocity through Eq. (7). Therefore, the observation of relaxation dominated by dislocation glide kinetics in series III is a verification of the proposed model.

A simple design rule can be derived from the kinetic graded buffer model: high growth temperatures should be used to maximize relaxation and minimize threading dislocation density in systems where dislocation glide kinetics dominate relaxation. Growth rate and grading rate could also be used to affect dislocation glide kinetics, but both have only linear effects and are constrained by the limitations of the growth process: order of magnitude changes in either parameter are not practical. Dislocation glide mobility is thermally-activated, therefore relatively small changes in growth temperature result in dramatic changes in dislocation dynamics. These arguments presume that the growth temperatures used are within the regime where dislocation glide kinetics dominate relaxation, which series III shows ranges at least from 650° C. to 800° C. for $In_xGa_{1-x}P$/GaP.

The new design rule that evolves from the invention is that branch defects must be controlled to achieve high-quality materials, because branch defects clearly dominate relaxation when they appear with any reasonable strength and density. The temperature dependence of branch defect evolution frustrates efforts to find a single ideal growth temperature. At high temperatures, the onset of branch defect formation is delayed and the branch defect density is low, but the branch defects quickly become very strong once they form. At low temperatures, branch defects are very weak, but they form almost immediately and with a high density.

The choice is clear for low indium compositions: a high growth temperature results in optimum material quality. The current results show that very high-quality materials can be grown without branch defects up to x~0.2 and higher growth temperatures may extend this range. For useful direct bandgap compositions of x>0.27, the formation of branch defects appears inevitable and additional process design is necessary.

Figure 23:
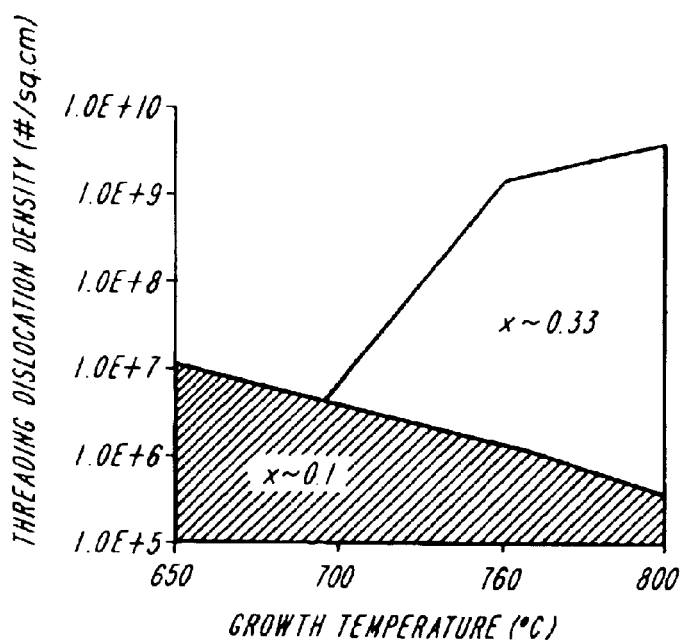
FIG. 23 is a graph showing a plot of $\rho_{overall}$ versus growth temperature for $In_xGa_{1-x}P/GaP$ graded to x~0.1 and x~0.33 at a single growth temperature.

If a single growth temperature is desired, FIG. 23 shows that 700° C. appears to be the optimal growth temperature. FIG. 23 is a graph showing a plot of $\rho_{overall}$ versus growth temperature for $In_xGa_{1-x}P$/GaP graded to x~0.1 and x~0.33 at a single growth temperature, i.e., series II and series III. A process window exists near 700° C. for the growth of high-quality material. Note that $\rho_{overall}$ and $\rho_{field}$ are used interchangeably at x~0.1, since pileup formation is negligible in those samples.

While series II suggests that $\rho_{overall}$ would continue to decrease with decreasing growth temperature due to the suppression of branch defects, series III clearly shows that $\rho_{field} > 10^7$ cm$^{-2}$ by x=0.15 at 650° C. due to slow dislocation glide kinetics. Threading dislocations present at x~0.15 cannot simply disappear and will persist with continued grading, even though faster dislocation glide kinetics could support efficient relaxation with increasingly lower $\rho_{overall}$ according to Eq. (7). Reduction of $\rho_{overall}$ is possible if dislocations glide to the edge of the material, terminate on heterogeneous defects, or annihilate each other and are not replaced, but none of these mechanisms are expected to be very strong in typical $In_xGa_{1-x}P$/GaP samples. Therefore, 700° C. appears to be the process window for the growth of high-quality $In_xGa_{1-x}P$/GaP at a single growth temperature in the system of the invention.

The success of series IV suggests a strategy to control branch defects: avoid branch defect formation for as long as possible and then suppress their strength once they become inevitable. A high growth temperature is used initially to avoid the formation of branch defects for as long as possible, then the growth temperature is abruptly dropped before the onset of branch defect formation to make the branch defects as weak as possible. Also, the lowest practical grading rate should be used to further suppress branch defect strength, as observed in the analysis of series II.

An optimization strategy for $In_xGa_{1-x}P$/GaP results from combining the high growth temperature and branch defect suppression design rules. The highest practical growth temperature should be used initially to satisfy both design rules: maximize dislocation glide kinetics and delay the onset of branch defect formation. Shortly before branch defect formation is inevitable, the growth temperature should be dropped to suppress branch defect strength. FIGS. 19 and 20 can be used to estimate how large a temperature drop is possible without increasing $\rho_{field}$ due to slow dislocation glide kinetics, as demonstrated in FIG. 24.

Figure 24:
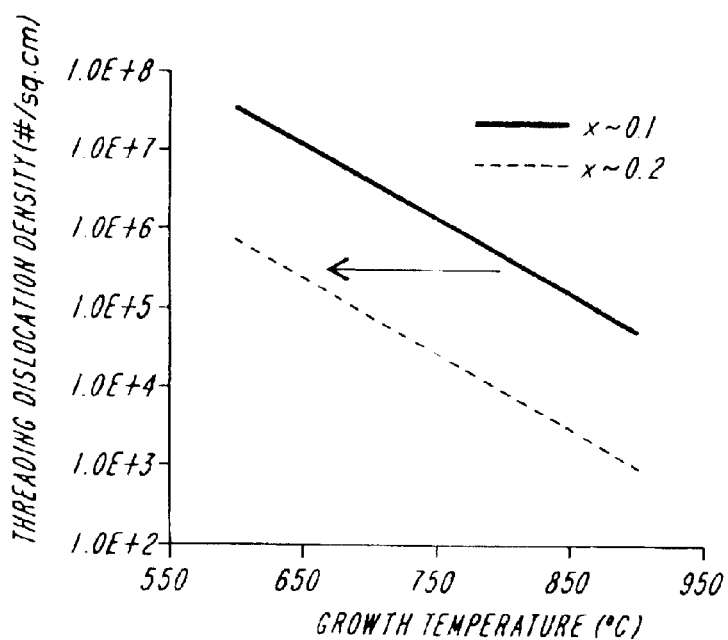
FIG. 24 is a graph showing a plot of $\rho_{field}$ versus growth temperature for $In_xGa_{1-x}P/GaP$ graded to x~0.1 and x~0.2.

FIG. 24 is a graph showing a plot of $\rho_{field}$ versus growth temperature for $In_xGa_{1-x}P$/GaP graded to x~0.1 and x~0.2, assuming relaxation is dominated by dislocation glide kinetics. The line for x~0.1 is taken from the data in series III, while the line for x~0.2 is estimated using the information in FIGS. 19 and 20. The arrow shows the largest temperature drop possible during grading without increasing $\rho_{field}$ due to slow dislocation glide kinetics. The degradation expected at 575° C. places a hard limit on the maximum practical temperature drop within the high temperature process window. If growth temperature must be dropped further, then the benefits of suppressing branch defect strength must be weighed against the limitation of dislocation glide kinetics and the material degradation that results near 575° C. due to branch defect roughening.

Optimization can be further complicated by other design rules that must be observed simultaneously. The other important design rule is to minimize surface roughness, otherwise interaction between dislocations and surface roughness will produce pileups. Surface roughness is in general minimized in the process of satisfying the first two design rules, especially if the grading rate is kept very low to suppress branch defects. It has been observed that while $\rho_{overall}$ remained nearly constant over a wide range of grading rates, surface morphology degraded with faster grading.

Surface roughness and pileup formation have been controlled by planarization during periodic growth interruptions in $Ge_xSi_{1-x}/Si$ and this technique may also be useful in $In_xGa_{1-x}P/GaP$ if branch defects can be sufficiently suppressed. Branch defects do not rely on surface topography to pin dislocations, so planarization cannot free dislocations pinned by strong branch defects. If branch defects are suppressed, $In_xGa_{1-x}P/GaP$ should behave similar to $Ge_xSi_{1-x}/Si$ and the planarization technique may yield significant improvements in defect density.

There are also basic limitations to the range of process parameters available. The growth technique limits growth temperature: GSMBE is limited to temperatures below 650° C., while practical MOVPE temperatures range roughly from 500° C. to 900° C. The ranges of practical growth rates and grading rates are also constrained by the capabilities of the growth technique. In general, the growth process must be optimized within the phase space allowed by the growth technique and materials system.

The most rational strategy for process optimization appears to have three main design rules. First and foremost, the formation of defect microstructures that pin dislocations must be controlled. Second, the growth temperature should be as high as possible to maximize dislocation glide kinetics and minimize defect density. Finally, the growth process must be designed to minimize surface roughness. These design rules operate simultaneously and any one of the phenomena can become dominant, but they are ordered by their apparent relative importance in $In_xGa_{1-x}P/GaP$.

Light-emitting diodes (LEDs) based on $In_{0.5}(Ga_yAl_{1-y})_{0.5}P$ alloys grown on GaAs substrates have recently emerged as the dominant technology for bright and efficient light emission in the green to red visible wavelengths. The novel application of highly-mismatched GaP window layers for improved current spreading and light extraction resulted in a nearly three-fold improvement in external quantum efficiency. Recently, transparent-substrate LEDs (TS-LEDs) were developed where the absorbing GaAs substrate is removed and replaced by a transparent GaP substrate, leading to a further two-fold improvement in external quantum efficiency over absorbing substrate LEDs. An additional advantage not specified in the literature is that the thermal conductivity of GaP is much higher than that of GaAs, allowing for higher power operation.

Figure 25:
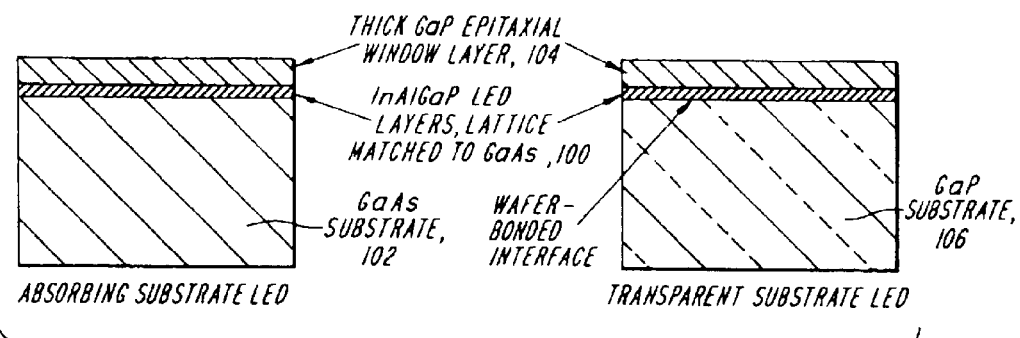
FIGS. 25 and 26 show LED devices.

The current TS-LED technology has been very successful and a schematic of the process is as follows with reference to FIG. 25. A normal $In_{0.5}(Ga_yAl_{1-y})_{0.5}P$ double heterostructure 100 LED is grown on GaAs substrate 102, a 45 µm GaP window layer 104 is grown on the LED structure, the GaAs substrate is etched away (not shown), and the LED structure with the thick GaP window layer is wafer-bonded to a GaP substrate 106. This technology has evolved successful commercial products.

There remain several opportunities for process improvement in the current TS-LED technology. The etching and wafer-bonding steps increase processing costs and are potential sources of reduced yield compared to traditional LED processes. The thick 45 µm GaP window layer is necessary to facilitate handling after the GaAs substrate is removed, but it is heavily-mismatched to the initial GaAs substrate, both in lattice constant and thermal expansion coefficient. The resulting heterostructure must exhibit significant curvature upon cooling and be difficult to handle and process. Furthermore, to make the growth of a 45 µm thick window layer practical, the $In_{0.5}(Ga_yAl_{1-y})_{0.5}P$ double heterostructure is grown by metal-organic vapor phase epitaxy (MOVPE) and then the GaP window layer is grown at extremely high growth rates by hydride vapor phase epitaxy (HVPE).

Furthermore, the active and cladding layers of the TS-LED technology are intrinsically limited to the lattice constant of GaAs. To obtain a range of wavelengths, aluminum must be added to the active layer, which generally requires additional aluminum in the cladding layers as well. Since point defect density tends to increase with increasing aluminum content, the practical efficiency and wavelength range of TS-LEDs are limited. A small range of operating wavelengths without adding aluminum to the active layer is possible if a strained quantum-well active layer is used, but a thick active layer is necessary for high light output.

An alternative approach is to grow LED structures on graded composition buffers of $In_xGa_{1-x}P$ grown on GaP ($In_xGa_{1-x}P/GaP$). Since the bandgap of $In_xGa_{1-x}P$ decreases steadily with increasing indium content, the GaP substrate and most of the $In_xGa_{1-x}P$ graded buffer is always transparent to the final $In_xGa_{1-x}P$ composition. The full range of visible wavelengths from green to the infrared are obtainable without adding aluminum to the active layer by controlling the final composition. This process has the advantage of being fully epitaxial and eliminating the etching and wafer-bonding steps of the current TS-LED technology. A series of LEDs grown by HVPE were tested and found that efficiency degraded as the emission wavelength was increased past 600 nm, which corresponds to $In_xGa_{1-x}P$ compositions of x>0.35. A gas-source molecular beam epitaxy (GSMBE) was used to grow a series of LEDs and observed degradation for compositions of x>0.32. In both instances, the degradation beyond x~0.3 is attributed to increasing dislocation density in $In_xGa_{1-x}P/GaP$ due to the increasing mismatch with GaP with continued grading.

The belief that dislocation density should increase with continued grading is based on a static interpretation of the relaxation process, while early work with graded buffers indicated a steady-state dynamic process that should feature a nearly constant dislocation density. Recent advances in $Ge_xSi_{1-x}/Si$ have demonstrated that increasing dislocation density with continued grading is due to the formation of pileups, predominantly due to a recursive and escalating interaction between dislocations and evolving surface roughness. Related work, with $In_xGa_{1-x}As/GaAs$ showed that the roughness and material properties of $In_xGa_{1-x}As/GaAs$ were heavily dependent on growth temperature, which suggested an opportunity for improving the quality of $In_xGa_{1-x}P/GaP$ by optimizing growth conditions.

Growth conditions for $In_xGa_{1-x}P/GaP$ grown by MOVPE were optimized, and a nearly steady state dislocation density of ~$5\times10^6$ cm$^{-2}$ for the composition range of x=0.09 to x=0.40 was obtained. A new defect microstructure called branch defects was identified and demonstrated to control the microstructure of $In_xGa_{1-x}P$ in the temperature range of 650° C. to 810° C. Applying the results to a wide range of literature, a picture for the evolution of microstructure in $In_xGa_{1-x}P$ and $In_xGa_{1-x}As$ ranging from roughly 300° C. to 800° C. has been proposed. These findings were condensed into a series of design rules and an optimization strategy for producing device-quality $In_xGa_{1-x}P$/Gap, which resulted in the recovery of a steady-state dislocation density.

Figure 26:
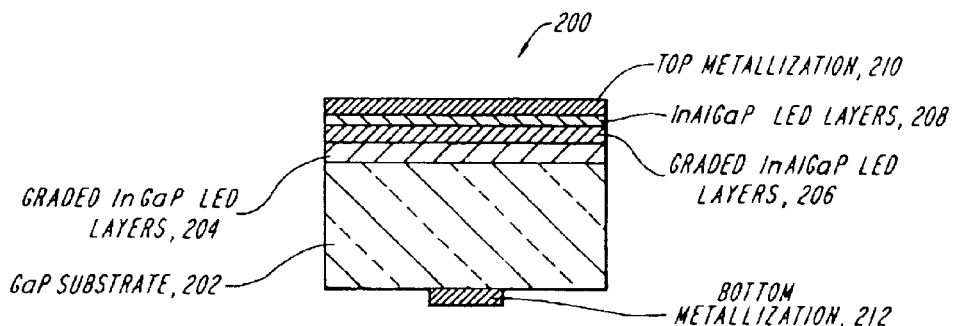

With the new capability to produce device quality $In_xGa_{1-x}P$/GaP over a wide composition range, an entirely epitaxial transparent-substrate LED (ETS-LED) 200 is shown in FIG. 26. Beginning with a GaP substrate 202, an optimized $In_xGa_{1-x}P$ graded buffer 204 doped sufficiently for low series resistance but low enough to not present a serious hindrance to dislocation glide dynamics is grown, typically $1\times10^{17}$ cm$^{-3}$ to $1\times10^{19}$ cm$^{-3}$, respectively. Si-doping on n-type substrates has been used, but any of the other known n-type dopants can be used, such as S, Te, and Ge, while p-type dopants such as Be, Zn, C, or Mg would be used with p-type substrates.

At a fixed composition of x or at a given $\Delta x$ below the desired final layer composition, optimized $In_x(Al_yGa_{1-y})_{1-y}P$ graded layers 206 are grown. Both the composition for transition from $In_xGa_{1-x}P$ to $In_x(Al_yGa_{1-y})_{1-x}P$ and the aluminum composition, y, used in that transition should be calculated such that the absorption edge of the entire GaP substrate and graded buffer structure are at least 25 nm from the emission peak of the final $In_xGa_{1-x}P$ active layer to minimize to self-absorption in the structure. Aluminum content is minimized by adding aluminum of y~0.15 at a composition roughly $\Delta x=0.05$ below the final layer composition. The $In_x(Al_yGa_{1-y})_{1-x}P$ graded layers are graded up to the desired lattice constant. Thereafter, InAlGaP LED layers 208 are grown lattice matched to the final desired lattice constant. The device structure can then be metallized with top 210 and bottom 212 metal contact layers, and processed into packaged LEDs using the same processes used for conventional LEDs.

The $In_x(Al_yGa_{1-y})_{1-x}P$ graded layers are necessary for full transparency to devices grown on top of the graded buffer. Aluminum can be added at the beginning of the graded buffer, but layers with such high aluminum percentage are very difficult to grow and transparency is then limited by the GaP substrate. Both the composition for transition from $In_xGa_{1-x}P$ graded layers to $In_x(Al_yGa_{1-y})_{1-x}P$ graded layers and the aluminum composition, y, used in that transition should be calculated such that the absorption edge of the GaP substrate and graded buffer are at least 25 nm from the emission peak of the LED to minimize self-absorption in the structure. One method to minimize aluminum is to add aluminum of y=0.15 at a composition roughly $\Delta x=0.05$ below the final desired lattice constant.

LED layers are presented herein as an exemplary embodiment of the device structure of the invention. However, a similar arrangement of semiconductor layers may be used to fabricate other optoelectronic devices including laser diodes and photodetectors.

The ETS-LED technology has many advantages over the current TS-LED technology. First, the process requirements are greatly reduced and simplified. The full heterostructure is entirely epitaxial, eliminating the need for etching and wafer bonding. Since a thick handling layer is unnecessary without the etching and wafer bonding steps and since the very thick GaP substrate acts as an excellent current spreading and light extraction window, the need to grow a thick GaP window on top of the LED structure is eliminated. If a GaP or $In_x(Ga_yAl_{1-x})P$ window layer is incorporated on ETS-LEDs, device wafer curvature can be decreased with increasing window layer thickness due to balancing of the thermal mismatch in the structure. Taking advantage of the flexibility to omit the window layer, however, both reduces the total epitaxial growth from >45 μm to <10 μm and eliminates the need for HVPE. The reduced film thickness reduces the effect of thermal mismatch between GaP and $In_x(Ga_yAl_{1-y})_{1-x}P$ compared to a thick GaP window on GaAs, hence device wafer curvature is significantly reduced compared to the TS-LED technology.

The device design and performance possibilities are also expanded in ETS-LEDs.

No aluminum is necessary in the active layer to obtain the full range of operating wavelengths possible in the $In_x(Ga_yAl_{1-y})_{1-x}P$ alloy system, which results in low point defect density in the active layer for higher performance and reliability. Furthermore, aluminum in the cladding layer can be minimized because the active layer is aluminum-free, resulting in better band offsets and reduced resistivity in the cladding layers. The upper cladding layer can also be mounted to a heat sink for very high power operation, since there is no upper GaP window.

$In_xGa_{1-x}P$/GaP has been grown and carefully characterized to extend the understanding of the closely coupled evolution of microstructure and dislocation dynamics in graded buffers. The growth experiments cover a temperature range of 650° C. to 810° C. and compositions ranging from x=0.09 to x=0.39. Within this phase space, three orders of magnitude of control over dislocation density has been demonstrated.

The mechanism for escalating defect density with continued grading in earlier $In_xGa_{1-x}P$/GaP work has been identified as pileup formation on branch defects. Experiments and modeling show that the effect of branch defects is controlled primarily by growth temperature. A simple process optimization has established a nearly steady-state level of control over dislocation density up to x=0.39, which appears to eliminate the barriers to device-quality materials encountered in earlier work.

At low indium compositions, where the effect of branch defects can be nearly completely eliminated, experiments and modeling show that dislocation glide kinetics dominate dislocation dynamics. This is the first experimental verification and extension of the proposed kinetic graded buffer model. The fact that the model was formulated for $Ge_xSi_{1-x}$/Si, yet finds application and verification in $In_xGa_{1-x}P$/GaP, suggests that it will be both powerful and widely applicable.

Through analysis of the literature in light of the new understanding of branch defects, we speculate that the evolution of branch defects dominates the microstructure of indium-bearing arsenides and phosphides over a very wide temperature range, roughly at least 500° C. to 800° C. Degradation due to branch defects appears to affect both lattice-matched and mismatched materials grown by MBE or MOVPE. The unified picture that emerges is that there is a low and high temperature process window for the growth of these materials.

By mapping the evolution of microstructure and dislocation dynamics throughout the experiments in the invention, the findings can be summarized in three design rules: branch defects must be avoided or suppressed, growth temperature must be maximized, and surface roughness must be minimized. If the branch defect design rule is generalized to say that any defect microstructure that hinders dislocation dynamics must be controlled, then these design rules are universally applicable to graded buffers.

Finally, considering the specific capabilities and limitations of the MOVPE growth process and the $In_xGa_{1-x}P/GaP$ material system, an optimization strategy was developed and applied. The first simple optimization resulted in the lowest accurate defect density in $In_xGa_{1-x}P/GaP$ graded to x>0.27 reported to date, $\rho_{overall}$=4.7×10$^6$ cm$^{-2}$ at x=0.39, thus proving the utility of the optimization strategy. With more sophisticated optimization, it will be possible to achieve $\rho_{overall}$ <10$^6$ cm$^{-2}$ for a full range of useful compositions, thus realizing the potential of $In_xGa_{1-x}P/GaP$ as a high-performance substrate for optoelectronic device applications.

Although the present invention has been shown and described with respect to several preferred embodiments thereof, various changes, omissions and additions to the form and detail thereof, may be made therein, without departing from the spirit and scope of the invention.

What is claimed is:

1. A method of forming a semiconductor structure comprising:
   providing a single crystal semiconductor substrate of GaP; and
   fabricating a graded composition buffer including a plurality of epitaxial semiconductor $In_x$, $(Al_yGa_{1-y})_{1-x}P$ alloy layers where y is greater than zero, said buffer comprising a first alloy layer immediately contacting the substrate having a lattice constant that is nearly identical to that of the substrate and a growth temperature greater than 650° C., subsequent alloy layers having lattice constants that differ from adjacent layers by less than 1%, and a final alloy layer having a lattice constant that is substantially different from the substrate, wherein growth temperature of the final alloy layer is at least 20° C. less than the growth temperature of the first alloy layer.

2. The method of claim 1, wherein growth temperature is decreased in at least one discrete transition during the growth of the graded composition buffer.

3. The method of claim 1, wherein the growth temperature of the first alloy is greater than or equal to 710° C.

4. The method of claim 2, wherein the growth temperature of the first alloy is greater than or equal to 710° C.

5. The method of claim 4, wherein first discrete transition in growth temperature ends in a growth temperature of 700° C. or lower and occurs at a composition where x is between 0.05 and 0.35.

6. The method of claim 5, wherein a second discrete transition in growth temperature ends in a growth temperature of 650° C. or lower and occurs at a composition where x is between 0.2 and 0.35.

7. The method of claim 6, wherein a third discrete transition in growth temperature ends in a growth temperature of 650° C. or lower and occurs at a composition where x is between 0.3 and 0.6.

8. The method of claim 4, wherein a plurality of subsequent discrete transitions in growth temperature ends in a final growth temperature between 575 and 700° C.

9. The method of claim 4, wherein a plurality of subsequent discrete transitions in growth temperature ends in a final growth temperature between 480 and 560° C.

10. The method of claim 4, wherein a first discrete transition in growth temperature ends in a growth temperature of 560° C. or lower and occurs at a composition where x is between 0.1 and 0.35.

11. The method of claim 2, wherein the growth temperature of the first alloy layer is greater than or equal to 750° C., a first discrete transition in growth temperature ends in a growth temperature of 675° C. and occurs at a composition where x=0.18.

12. The method of claim 11 wherein a second discrete transition in growth temperature ends in a growth temperature of 650° C. and occurs at a composition where x=0.27.

13. The method of claim 12, wherein a third discrete transition in growth temperature ends in a growth temperature of 625° C. and occurs at a composition where x=0.4.

14. The method of claim 11, wherein a second discrete transition in growth temperature ends in a growth temperature between 525 and 550° C. and occurs at a composition where x is between 0.25 and 0.35.

15. The method of claim 2, wherein the growth temperature of the first alloy layer is greater than or equal to 760° C., a first discrete transition in growth temperature ends in a growth temperature between 525 and 550° C. and occurs at a composition where x=0.18.

16. The method of claim 1, wherein the substrate and the graded composition buffer are electrically doped with elements.

17. The method of claim 16, wherein the dopant elements comprise n-type dopants.

18. The method of claim 17, wherein the dopant element in the graded composition buffer comprises Si.

19. The method of claim 16, wherein the dopant elements comprise p-type dopants.

20. The method of claim 16, wherein the concentration of the dopant element in the alloy layers of the graded composition buffer is between 5×10$^{16}$ and 5×10$^{18}$cm$^{-3}$.

21. The method of claim 18 wherein the concentration of Si in the alloy layers of the graded composition buffer is between 1×10$^{17}$ and 5×10$^{18}$cm$^3$.

22. The method of claim 2 wherein the substrate is electrically doped with an n-type dopant, the graded composition buffer is electrically doped with Si at a concentration between 1×10$^{17}$ and 2×10$^{18}$ cm$^{-3}$, the growth temperature of the first alloy layer is greater than or equal to 750° C., a first discrete transition in growth temperature ends in a growth temperature of 700° C. or lower and occurs at a composition where x is between 0.13 and 0.2.

23. The method of claim 1, wherein aluminum is present in the alloys alloys (y>0) such that the grade composition buffer is transparent to light emitted or absorbed by $In_xGa_{1-x}P$ lattice-matched to the final alloy layer.

24. The method of claim 23, wherein aluminum concentration in the alloy layers is such that y equals or is greater than 0.02.

25. The method of claim 23, wherein y equals or is greater than 0.05 beginning at a composition where x equals or is greater than 0.25.

26. The method of claim 23, wherein y equals or is greater than 0.05 beginning at a composition where x is at least 0.02 less than it is in the final alloy layer.

27. The method of claim 1, wherein semiconductor layers are incorporated on the graded composition buffer, and said layers comprise at least one strain-balancing semiconductor layer with nominally the same coefficient of thermal expansion as GaP.

28. The method of claim 27, wherein the strain balancing semiconductor layer comprises $In_xGa_{1-x}P$ with a lattice constant smaller than that of the final alloy layer of the grade composition buffer.

29. The method of claim 28, wherein the strain balancing semiconductor layer is at least 5 microns in thickness.

30. The method of claim 27, wherein the strain balancing semiconductor layer comprises GaP.

31. The method claim of claim 27, wherein the strain balancing semiconductor layer comprises an epitaxial layer.

32. The method claim of claim 27, wherein the strain balancing semiconductor layer comprises a wafer-bonded layer.

33. The method of claim 30, wherein the strain-balancing semiconductor layer is at least 5 microns in thickness.

34. The method of claim 1, wherein additional layers are deposited on the graded composition buffer in order to fabricate optoelectronic devices thereon.

35. The method of claim 34, wherein at least one of the additional layers is an active layer whose purpose is to emit or absorb light.

36. The method of claim 35, wherein aluminum is present (y>0) in the alloy layers of the graded composition buffer such that the graded composition buffer is transparent to light emitted or absorbed by the active layer or active layers.

37. The method of claim 36, wherein aluminum concentration in the alloy layers of the graded composition buffer is such that y equals or is greater than 0.02.

38. The method of claim 37, wherein y equals or is greater than 0.05 beginning at a composition where x equals or is greater than 0.25.

39. The method of claim 38, wherein y equals or is greater than 0.05 beginning at a composition where x is at least 0.02 less than it is in the final alloy layer of the graded composition buffer.

40. The method of claim 34, wherein the optoelectronic devices comprise light-emitting diodes.

41. The method of claim 34, wherein the optoelectronic devices comprise laser diodes.

42. The method of claim 34, wherein the optoelectronic devices comprise photodetectors.

43. The method of claim 34, wherein the optoelectronic devices comprise photocathodes.

44. The method of claim 34, wherein the optoelectronic devices comprise modulators.

45. The method of claim 1, wherein the alloy layers in the graded composition buffer comprise indium gallium phosphide where the lattice constant differs between adjacent layers by less than 0.2%, the substrate is electrically doped with an n-type dopant, the graded composition buffer is electrically doped with Si to a concentration of $7 \times 10^{17}$ cm$^{-3}$, the first alloy layer of the graded composition buffer is grown at 800° C., the first discrete transition in growth temperature ends in a growth temperature of 675° C. and occurs at a composition where x=0.18, the second discrete transition in growth temperature ends in a growth temperature of 650° C. and occurs at a composition where x=0.26.

46. The method of claim 45, wherein a light-emitting diode is deposited after the final alloy layer of the graded composition buffer.

47. The method of claim 45, wherein a light-emitting diode is deposited after the final alloy layer of the graded composition buffer and a GaP strain-balancing layer is deposited with a thickness of at least 5 microns.

48. The method of claim 45, wherein a third discrete transition in growth temperature ends in a growth temperature of 625° C. and occurs at a composition where x=0.40.

49. The method of claim 48, wherein a light-emitting diode is deposited after the final alloy layer of the graded composition buffer.

50. The method of claim 48, wherein a light-emitting diode is deposited after the final alloy layer of the graded composition buffer and a GaP strain-balancing layer is deposited with a thickness of at least 5 microns.

51. The method of claim 1, wherein the alloy layers in the graded composition buffer comprise indium gallium phosphide where the lattice constant differs between adjacent layers by less than 0.2%, the substrate is electrically doped with an n-type dopant, the graded composition buffer is electrically doped with Si to a concentration of $7 \times 10^{17}$ cm$^{-3}$, the first alloy layer of the graded composition buffer is grown at 800° C., the first discrete transition in growth temperature ends in a growth temperature of 675° C. and occurs at a composition where x=0.18, and aluminum composition in the alloy layers is y=0.15 for alloy compositions greater than or equal to x=0.25.

52. The method of claim 51, wherein additional layers are deposited on the final alloy layer of the graded composition buffer.

53. The method of claim 52, wherein the additional layers form the structure for a light-emitting diode.

54. The method of 53, wherein a strain-balancing GaP layer at least 5 microns in thickness is deposited on the light-emitting diode structure.

55. A semiconductor structure comprising:
a single crystal semiconductor substrate of GaP; and
a graded composition buffer including a plurality of epitaxial semiconductor In$_x$Ga$_{1-x}$P alloy layers where v is greater than zero, said buffer comprising a first alloy layer immediately contacting the substrate having a lattice constant that is nearly identical to that of the substrate and a growth temperature greater than 650° C., subsequent alloy layers having lattice constants that differ from adjacent layers by less than 1%, and a final alloy layer having a lattice constant that is substantially different from the substrate, wherein growth temperature of the final alloy layer is at least 20° C. less than the growth temperature of the first alloy layer.

56. A method of forming a semiconductor structure comprising:
providing a single crystal semiconductor substrate of GaP; and
fabricating a graded composition buffer including a plurality of epitaxial semiconductor In$_x$Ga$_{1-x}$P alloy layers where v is greater than zero, said buffer comprising a first alloy layer immediately contacting the substrate having a lattice constant that is nearly identical to that of the substrate, subsequent alloy layers having lattice constants that differ from adjacent layers by less than 1%, and a final alloy layer having a lattice constant that is substantially different from the substrate, wherein growth temperature of the final alloy layer is at least 20° C. less than the growth temperature of the first alloy layer.

* * * * *

UNITED STATES PATENT AND TRADEMARK OFFICE
CERTIFICATE OF CORRECTION

| | | |
|---|---|---|
| PATENT NO. | : 6,805,744 B2 | Page 1 of 1 |
| APPLICATION NO. | : 10/023047 | |
| DATED | : October 19, 2004 | |
| INVENTOR(S) | : Kim et al. | |

It is certified that error appears in the above-identified patent and that said Letters Patent is hereby corrected as shown below:

Please replace the following at column 1, line 10

--This invention was made with government support under Grant No. DAAG55-97-1-0111, awarded by the ARO. The government has certain rights in this invention.--

Signed and Sealed this

Nineteenth Day of April, 2011

David J. Kappos
*Director of the United States Patent and Trademark Office*